(12) United States Patent
Furukawa et al.

(10) Patent No.: US 7,256,415 B2
(45) Date of Patent: Aug. 14, 2007

(54) MEMORY DEVICE AND METHOD OF MANUFACTURING THE DEVICE BY SIMULTANEOUSLY CONDITIONING TRANSITION METAL OXIDE LAYERS IN A PLURALITY OF MEMORY CELLS

(75) Inventors: Toshijaru Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US); Chung H. Lam, Peekskill, NY (US); Gerhard I. Meijer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 11/140,780

(22) Filed: May 31, 2005

(65) Prior Publication Data

US 2006/0267086 A1    Nov. 30, 2006

(51) Int. Cl.
*H01L 47/00* (2006.01)
(52) U.S. Cl. .................. 257/2; 257/4; 257/E45.003; 438/104; 438/900
(58) Field of Classification Search ............. 257/2
See application file for complete search history.

(56) References Cited

U.S. PATENT DOCUMENTS 4,163,243 A    7/1979   Kamins et al.
5,753,945 A    5/1998   Chivukula et al.
6,204,139 B1   3/2001   Liu et al.
6,583,003 B1   6/2003   Hsu et al.
6,664,117 B2   12/2003  Zhuang et al.

(Continued)

FOREIGN PATENT DOCUMENTS

WO    WO 00/49659    8/2000

OTHER PUBLICATIONS

Rossel, et al., "Electrical Current Distribution Across a Metal-Insulator-Metal Structure During Bistable Switching," Journal of Applied Physics, vol. 90, No. 6, Sep. 15, 2001, pp. 2892-2898.

(Continued)

*Primary Examiner*—Tu-Tu Ho
(74) *Attorney, Agent, or Firm*—Gibb & Rahman, LLC; Ido Tuchman, Esq.

(57)    ABSTRACT

Disclosed are non-volatile memory devices that incorporate a series of single or double memory cells. The single memory cells are essentially "U" shaped. The double memory cells comprise two essentially "U" shaped memory cells. Each memory cell comprises a memory element having a bi-stable layer sandwiched between two conductive layers. A temporary conductor may be applied to a series of cells and used to bulk condition the bi-stable layers of the cells. Also, due to the "U" shape of the cells, a cross point wire array may be used to connect a series of cells. The cross point wire array allows the memory elements of each cell to be individually identified and addressed for storing information and also allows for the information stored in the memory elements in all of the cells in the series to be simultaneously erased using a block erase process.

10 Claims, 19 Drawing Sheets

U.S. PATENT DOCUMENTS

| | | |
|---|---|---|
| 6,673,691 B2 | 1/2004 | Zhuang et al. |
| 6,753,561 B1 | 6/2004 | Rinerson et al. |
| 6,762,481 B2 | 7/2004 | Liu et al. |
| 6,787,414 B2 | 9/2004 | Lee |
| 6,787,843 B2 | 9/2004 | Tempel |
| 6,815,744 B1 | 11/2004 | Beck et al. |
| 2005/0122768 A1* | 6/2005 | Fukumoto .................. 365/158 |
| 2006/0171200 A1* | 8/2006 | Rinerson et al. ......... 365/185.1 |

OTHER PUBLICATIONS

Beck, et al., "Reproducible Switching Effect in Thin Oxide Films for Memory Applications," Applied Physics Letter, vol. 77, No. 1, Jul. 3, 2000, pp. 139-141.

Watanabe, et al., "Current-Driven Insulator-Conductor Transition and Nonvolatile Memory in Chromium-Doped $SrTiO_3$ Single Crystals," Applied Physics Letters, vol. 78, No. 23, Jun. 4, 2001, pp. 3738-3740.

* cited by examiner

MEMORY DEVICE AND METHOD OF MANUFACTURING THE DEVICE BY SIMULTANEOUSLY CONDITIONING TRANSITION METAL OXIDE LAYERS IN A PLURALITY OF MEMORY CELLS

BACKGROUND OF THE INVENTION

1. Field of the Invention

The present invention relates generally to a non-volatile memory device and an associated fabrication method. Particularly, the invention relates to a non-volatile memory device that incorporates a series of either single memory cells or double memory cells having memory elements comprising a bi-stable layer with programmable electrical resistance sandwiched between two conductive layers. Additionally, the invention relates to a method for manufacturing the non-volatile memory device that incorporates a process for simultaneously conditioning the transition metal oxide layers of each memory cell in a series such that the transition metal oxide layers exhibit a bi-stable electrical resistance.

2. Description of the Related Art

Flash erasable programmable read only memory (FEPROM or flash memory) is used in semiconductor devices and provides for rapid block erase operations. Flash memory generally requires only the use of one transistor per memory cell versus the two transistors per memory cell required for conventional electrically erasable programmable read only memory (EEPROM). Thus, flash memory takes up less space on a semiconductor device and is less expensive to produce. However, the need to develop further space saving components and to remain cost efficient in the fabrication of semiconductor devices continues. To that end, the use of materials with programmable electrical resistance for semiconductor device applications has been studied. The electrical resistance of resistance-switching materials, including but not limited to transition metal oxide materials, can be changed significantly by external influences, including temperature, magnetic fields and electric fields. Electrical impulses applied to theses materials can "program" them, such that they exhibit a desired resistive property. Specifically, the following referenced articles, international application and U.S. Patent, all of which are hereby expressly incorporated by reference into the present invention for purposes including, but not limited to, indicating the background of the present invention and illustrating the state of the art, describe materials and classes of materials with programmable electrical resistance and simple electrical resistor devices made from these materials: "Reproducible switching effect in thin oxide films for memory applications" (A. Beck et al., Applied Physics Letters, Vol. 77, No. 1, July 2000); "Current-driven insulator-conductor transition and non-volatile memory in chromium-doped $SrTiO_3$ single crystals" (Y. Watanabe et al., Applied Physics Letters, Vol. 78, No. 23, June 2001); "Electrical current distribution across a metal-insulator-metal structure during bi-stable switching" (C. Rossel et al., Journal of Applied Physics, Vol. 90, No. 6, September 2001); International Application Pub. No. WO 00/49659 A1; and, U.S. Pat. No. 6,204,139 issued to Liu et al. on Mar. 20, 2001. Transition metal oxide materials are one class of materials that can be conditioned such that they exhibit a bi-stable electrical resistance and, therefore, they have a wide range of potential applications. One possible use for such materials with programmable electrical resistance is in the memory cells of non-volatile memory devices. The present invention provides an improved non-volatile memory device and an improved method for fabricating the non-volatile memory device.

SUMMARY OF THE INVENTION

This disclosure presents a non-volatile memory device and an associated fabrication method. Particularly, a non-volatile memory device is disclosed that incorporates a series of either single memory cells or dual memory cells having memory elements comprising a bi-stable layer sandwiched between two conductive layers. More particularly, a method for manufacturing the non-volatile memory device is disclosed that incorporates a process for simultaneously conditioning the transition metal oxide layers of a plurality of memory elements of either single or double memory cells such that the transition metal oxide layers exhibit a bi-stable electrical resistance.

In one embodiment of the structure, the non-volatile memory device comprises a series of essentially "U" shaped single memory cell structures on a semiconductor device. Each single memory cell is separated from its neighbor by an insulating material. Each single memory cell comprises two sections (a memory element and a conductive section) physically in parallel. The memory element has a first top electrical contact and a first bottom surface. The memory element comprises a first conductive layer, a bi-stable layer on the first conductive layer and a second conductive layer on the bi-stable layer. The bi-stable layer comprises a material that exhibits a bi-stable electrical resistance. Particularly, the bi-stable layer comprises a conditioned transition metal oxide. For example, the bi-stable layer can comprise a conditioned transition metal oxide perovskite such as chromium-doped strontium titanium oxide (Cr-doped $SrTiO_3$). The programmable electrical resistance of the bi-stable layer of the memory element allows information to be repeatedly stored in and erased from the memory element. The conductive section has a second top electrical contact and a second bottom surface. The conductive section further comprises a conductive material. A diode (e.g. zener diode) electrically connects the bottom surface of the first section (i.e., memory element) with the bottom surface of the conductive section to allow electrical current to pass between the sections. Single memory cells may be formed in a series. Due to the "U" shape of each single memory cell, a cross point wire array may be used to connect the cells in the series. The cross point wire array may comprise first direction wires connecting the first top electrical contacts of the first sections (i.e., memory elements) of each single memory cell in the series and second direction wires connecting the second top electrical contacts of the conductive sections of single memory cells in the series. The cross point wire array allows the memory elements (i.e., first sections with the bi-stable layer) to be addressed individually for storing information and allows a block erase process to be used to simultaneously erase the information stored in the memory elements of all of the single memory cells within the series.

Another embodiment of the structure of the non-volatile memory device comprises a series of double memory cells on a semiconductor device. Each double memory cell is separated from its neighbor by an insulating material. Each double memory cell comprises two essentially "U" shaped memory cells. Specifically, each double memory cell comprises three parallel sections, including two first sections, comprising first and second memory elements, and a second section (i.e., a conductive section) between the two first sections. The two first sections each have a corresponding top electrical contact and a bottom surface (e.g., a first top electrical contact and first bottom surface for the first memory element and a second top electrical contact and second bottom surface for the second memory element). The two first sections (i.e., first and second memory elements) each comprise a first conductive layer, a bi-stable layer on the first conductive layer and a second conductive layer on the bi-stable layer. The bi-stable layer comprises a material that exhibits a bi-stable electrical resistance. Particularly, the bi-stable layer comprises a conditioned transition metal oxide. For example, the bi-stable layer can comprise a conditioned transition metal oxide perovskite such as chromium-doped strontium titanium oxide (Cr-doped $SrTiO_3$). The programmable electrical resistance of the bi-stable layer of the memory element allows information to be repeatedly stored in and erased from the memory element. The conductive section of the double memory cell also has a third top electrical contact and a third bottom surface. The conductive section of the double memory cell further comprises a conductive material. Diodes (e.g. zener diodes) electrically connect the bottom surfaces of each of the two first sections with the bottom surface of the conductive section to allow electrical current to pass between the conductive section and the first memory element and between the conductive section and the second memory element. Thus, each double memory cell comprises two essentially "U" shaped separate memory cells, each with a shared conductive section and a diode connecting the shared section to a memory element. Double memory cells may be formed in a series. Due to the "U" shape of each separate memory cell in each double memory cell, a cross point wire array may be used to connect the double memory cells in the series. The cross point wire array may comprise first direction wires connecting the first top electrical contacts of the first memory element from a plurality of cells in the series together, other first direction wires connecting the second top electrical contacts of the second memory element from a plurality of cells in the series together and second directions wires connecting the third top electrical contacts of the conductive sections from a plurality of cells in the series together. The cross point wire array allows each of the first and second memory elements of each double memory cell to be addressed individually for storing information and allows a block erase process to be used to simultaneously erase the information stored in the memory elements of all the double memory cells within the series.

In an embodiment of the method of forming a structure of the present invention, a series of essentially "U" shaped single memory cells are formed simultaneously. Each single memory cell in the series comprises a first section (i.e., a memory element) physically in parallel with a second section (i.e., conductive section). Each memory element has a first top electrical contact and a first bottom surface. Each second section (i.e., conductive section) similarly has a second top electrical contact and a second bottom surface. Each memory element further comprises a first conductive layer, a transition metal oxide layer on the first conductive layer, and a second conductive layer on the transition metal oxide layer. Each conductive section comprises a conductive material. A diode (e.g. zener diode) electrically connects the first bottom surface and the second bottom surface and is configured to allow electric current to pass between the two sections.

To form a single memory cell, a first hole and a second hole can be formed parallel to each other in an insulating layer over a second-type silicon island that is surrounded by insulating material. The first and second holes are etched to a depth such that they expose corresponding portions of the second-type silicon island. Then, a first-type silicon can be formed in the exposed portion of the second-type silicon island corresponding to the first hole thereby forming a diode (e.g., zener diodes) between the first and second holes. This is accomplished by implanting the exposed portion of the second-type silicon in the first hole with an appropriate dopant and performing an anneal. Once the diode is formed, a first section (i.e., memory element) is formed in the first hole with a transition metal oxide layer sandwiched between two conductive layers. Specifically, a first conductive layer is deposited in the first hole on the first-type silicon section and then recessed. A conformal transition metal oxide layer is then deposited on the first conductive layer and a second conductive layer is deposited on the transition metal oxide layer. The second section (i.e., conductive section) may be formed simultaneously with the memory element and in the same manner. Alternatively, the conductive section may be masked after recessing the first conductive layer and prior to depositing the transition metal oxide layer. After the transition metal oxide layer is deposited the mask can be removed so that the conductive section comprises only conductive material (i.e., the first and second conductive layers). Regardless of the composition of the conductive section, only the first section functions as a memory element.

In order for the device to function as a memory device, the transition metal oxide layer of the memory element must be conditioned to exhibit the desired bi-stable resistance. A series of single memory cells may be conditioned simultaneously. The conditioning process comprises subjecting the transition metal oxide layer to an appropriate electrical current for a sufficient period of time to allow the transition metal oxide layer to exhibit a desired bi-stable electrical resistance. This is accomplished by connecting alternating first top electrical contacts and second top electrical contacts of adjacent single memory cells in the series with a temporary conductor. The temporary conductor is then connected to a power source adapted to output an appropriate electrical current through the plurality of single memory cells in the series. As the transition metal oxide layers of each of the memory elements of each cell in the series are conditioned, the voltage output of the power source is reduced. Once the transition metal oxide layers of cells in the series are conditioned, the temporary conductor is removed. Due to the "U" shape of each cell, a cross point wire array can then be formed on the series to connect the single memory cells. The resulting structure is a non-volatile memory device comprising a series of single memory cells that can be employed for repeatedly storing and erasing information. The cross point wire array allows the memory elements (i.e., first sections with the bi-stable layer) to be addressed individually for storing information and allows a block erase process to be used to simultaneously erase the information stored in the memory elements of all of the single memory cells within the series.

In another embodiment of the method of forming a structure of the present invention, a series of double memory cell structures are formed simultaneously. Each double memory cell comprises two essentially "U" shaped memory cells. More particularly, each double memory cell in the series comprises three parallel sections including two first sections (i.e., a first memory element and a second memory element) and a second section (i.e., conductive section). Each of the two first sections has a corresponding top electrical contact and a bottom surface. Each conductive section also has a top electrical contact and a bottom surface. The first and second memory elements comprise a transition metal oxide layer on a first conductive layer and a second conductive layer on the transition metal oxide layer. Each conductive section comprises a conductive material. The bottom surfaces of the first and second memory elements are each electrically connected to the bottom surface of the conductive section through a diode. Each diode (e.g., zener diode) is configured to allow electric current to pass between the conductive section and the first memory element and between the conductive section and the second memory element, respectively. Each of the two memory cells of the double memory cell, thus, comprises a memory element and shares the conductive section.

To form a double memory cell, three parallel holes (e.g., two first holes and a second hole) can be formed in an insulating layer over a second-type silicon island that is surrounded by insulating material. The three holes are etched to a depth such that they expose corresponding portions of the second-type silicon island. Then, two first-type silicon sections are formed in the exposed portion of the second-type silicon corresponding to the two first holes thereby forming corresponding diodes (e.g., zener diodes) between each of the first holes and the second hole. This is accomplished by implanting the exposed portions of the second-type silicon in the two first holes with an appropriate dopant and performing an anneal. Once these diodes are formed, the first and second memory elements are formed within the two first holes. A first conductive layer can be deposited in the two first holes on the first-type silicon sections and also in the second hole on the second-type silicon. The first conductive layer is recessed and then a transition metal oxide layer is deposited on the first conductive layer. A second conductive layer is then deposited on the transition metal oxide layer. The conductive section may be formed simultaneously with and in the same manner as the first sections (i.e., first and second memory elements). Alternatively, after recessing the first conductive layer and prior to depositing the transition metal oxide layer, the second hole may be masked. The mask can be removed prior to depositing the second conductive layer such that the conductive section comprises only conductive material (i.e., the first conductive layer and the second conductive layer). Regardless of the composition of the conductive section, only the first sections function as memory elements.

In order for the device to function as a memory device, the transition metal oxide layers of each memory element must be conditioned to exhibit the desired bi-stable resistance. The conditioning process comprises subjecting the transition metal oxide layer in each first section to an appropriate electrical current for a sufficient period of time to allow the transition metal oxide layer to exhibit the desired bi-stable electrical resistance. Specifically, the conditioning process for the transition metal oxide layers in the two first sections of the double memory cells in a series is a two-stage conditioning process. First, the transition metal oxide layers of the first memory element of each double memory cell in the series are simultaneously conditioned. Second, the transition metal oxide layers of the second memory element of each double memory cell in the series are conditioned simultaneously. Specifically, during the first stage of conditioning, the first top electrical contact of the first memory element from each of the double memory cells in the series is connected to the third top electrical contact of a conductive section of an adjacent double memory cell in the series with a temporary conductor. The temporary conductor is then connected to a power source adapted to output an electrical current through the plurality of double memory cells in the series. An appropriate electrical current is output from the power source through the double memory cells in the series via the temporary conductor. As the transition metal oxide layers from the first memory elements in the series of double memory cells are conditioned, the voltage output of the power source is reduced. Once the transition metal oxide layer from all of the first memory elements of each of the double memory cells in the series exhibit the desired bi-stable resistance, the temporary conductors are removed. The second stage of the conditioning process similarly conditions the second memory element of each of the double memory cells in the series simultaneously by again forming temporary conductors on the series. Once the transition metal oxide layers from all of the second memory elements exhibit the desired bi-stable resistance, the temporary conductors are removed. Due to the "U" shape of each of the two memory cells within the double memory cells, a cross point wire array can be used to connect the double memory cells in the series. The cross point wire array allows the first and second memory elements of each of the two memory cells within the double memory cell to be addressed individually for storing information and further allows a block erase process to be used to simultaneously erase the information stored in the memory elements of all of the double memory cells within the series.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
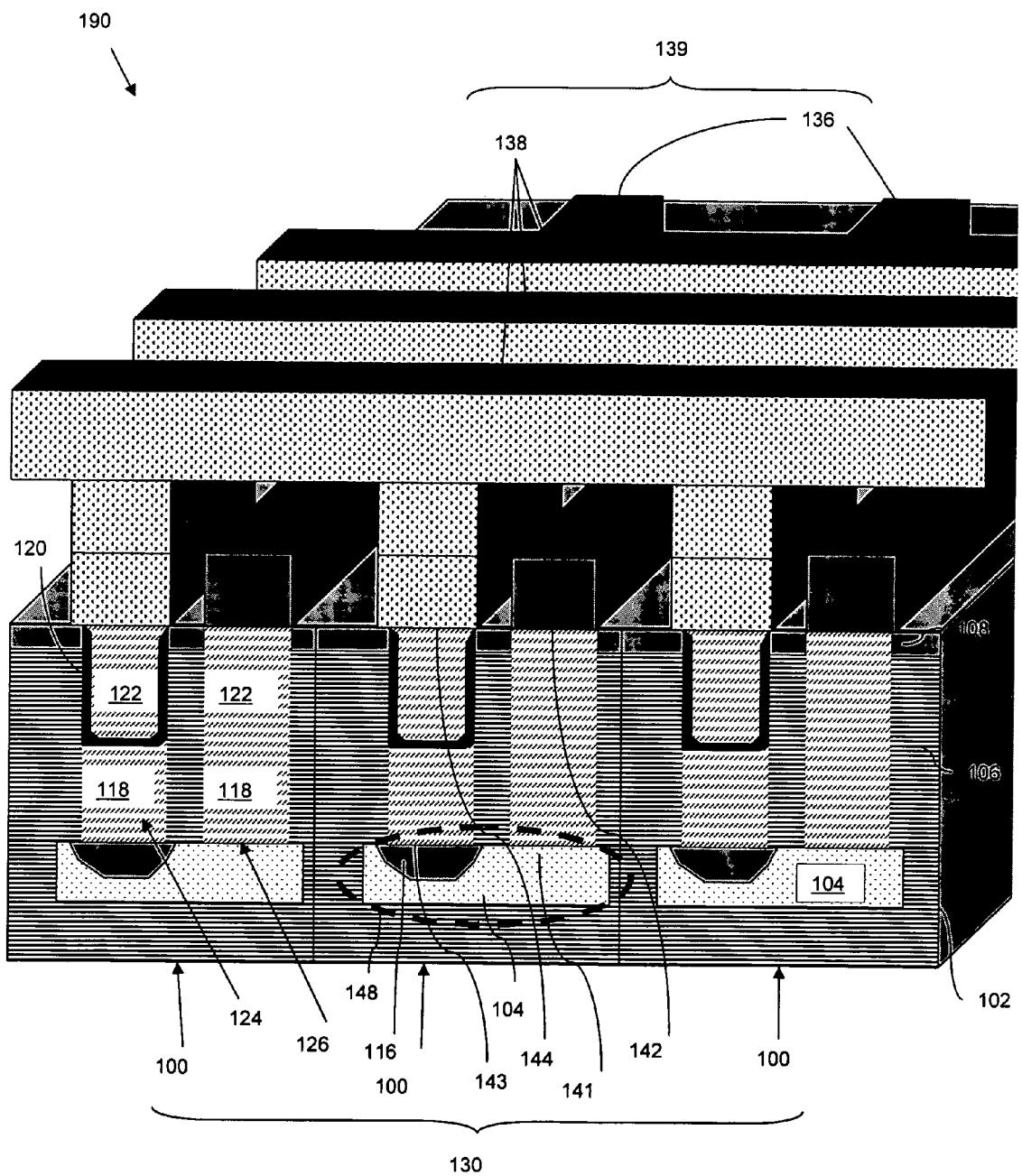
FIG. 1 is a schematic drawing illustrating one embodiment of a completed non-volatile memory device of the present invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

This disclosure presents a non-volatile memory device and an associated fabrication method. A non-volatile memory device is disclosed that incorporates a series of either single memory cells or double memory cells having memory elements comprising a bi-stable layer with programmable electrical resistance sandwiched between two conductive layers. Additionally, a method for manufacturing the non-volatile memory device is disclosed that incorporates a process for simultaneously conditioning the transition metal oxide layers of a plurality of memory elements of either single or double memory cells such that the transition metal oxide layers exhibit a desired bi-stable electrical resistance.

Referring to FIG. 1, a first embodiment of the structure of a non-volatile memory device 190 comprises a series 130 of "U" shaped single memory cells 100. Each single memory cell 100 is isolated in the series 130 by insulating layers 102 and 106. Insulating layer 106 may be covered and protected by a nitride layer 108. Each single memory cell 100 comprises a first section 124 (i.e., memory element) physically parallel to a conductive section 126. Each first section 124 has a first top electrical contact 144 and a first bottom surface 143. Each conductive section has a second top electrical contact 142 and a second bottom surface 141. Each first section 124 is electrically connected to each conductive section 126 via a conductor comprising a diode 148 (e.g., a zener diode). Each diode 148 can comprise a first-type silicon section 116 contacting the first section 124 and disposed within a second-type silicon section 104 contacting the conductive section 126. The diode 148 is adapted to allow electric current to flow between the first section 124 and the conductive section 126.

Figure 10:
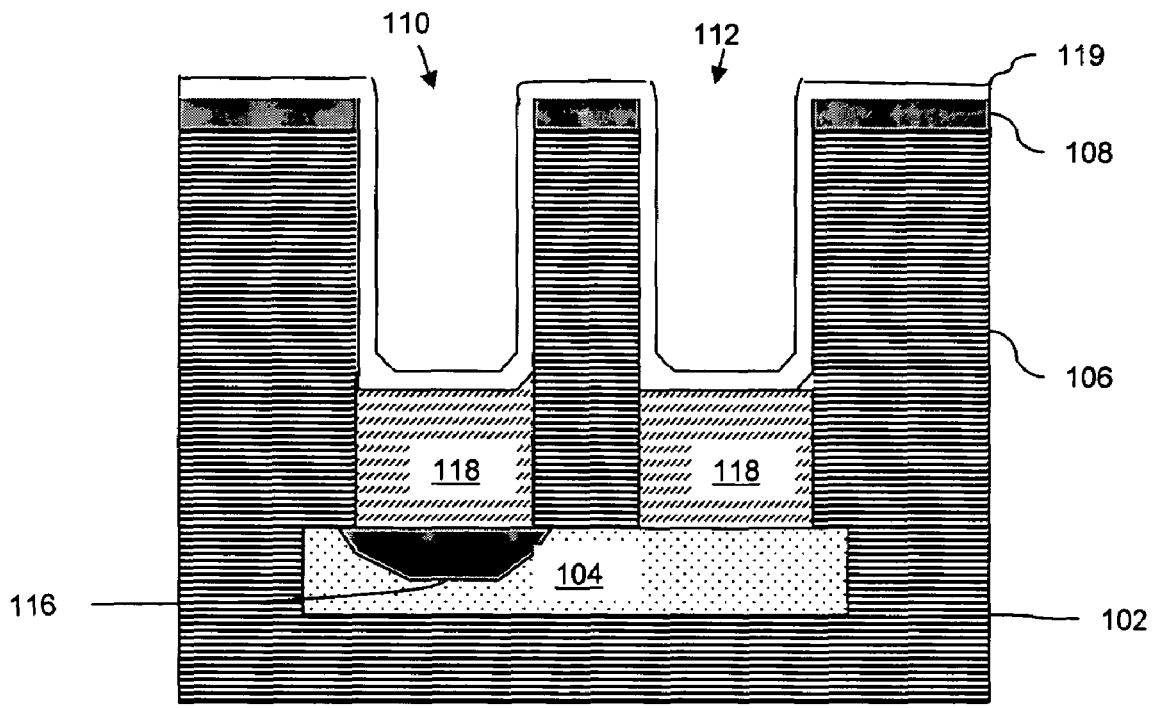
Figure 11:
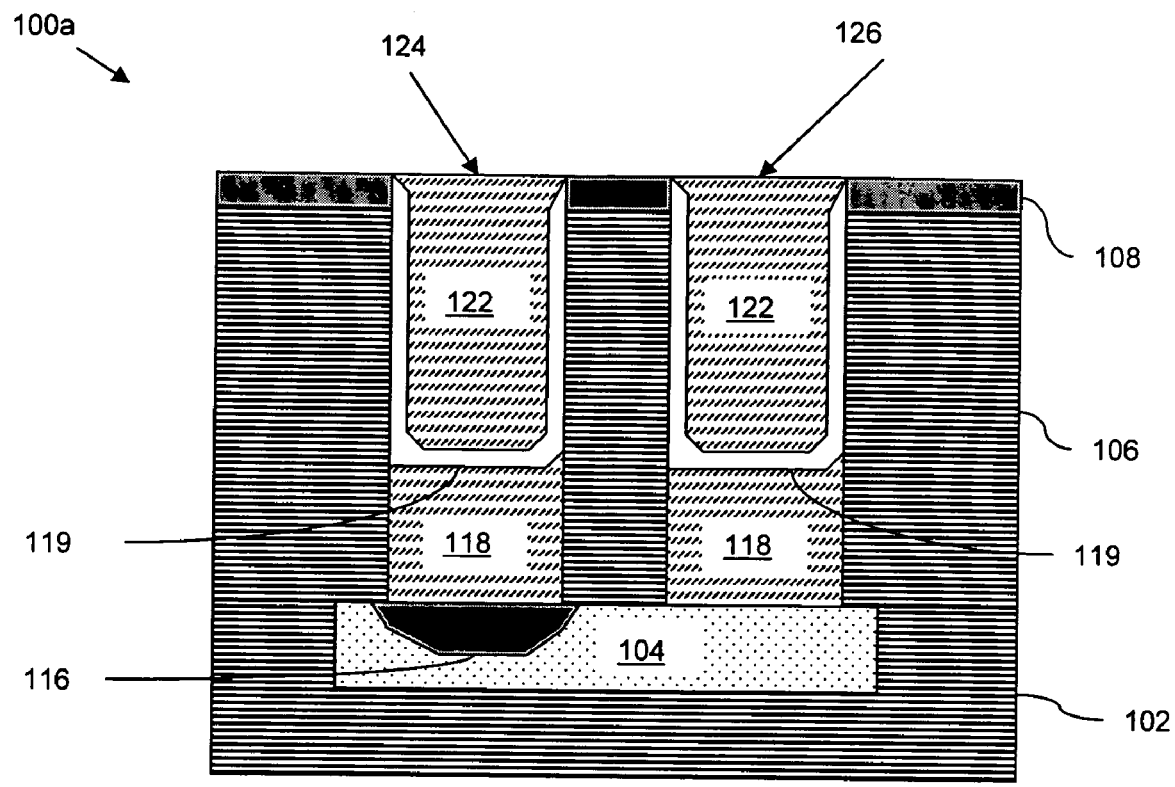

The first section 124 is a memory element and comprises a bi-stable layer 120 sandwiched between a first conductive layer 118 and a second conductive layer 122. The second section 126 (i.e., conductive section) comprises a conductive material. For example, the conductive section 126 may comprise conductive layers 118 and 122 (as illustrated in FIG. 1). Alternatively, the conductive section 126 may be formed in the same manner as the first section 124 with a bi-stable layer 120 between the conductive layers 118 and 122 (e.g., see the partially completed structures of FIG. 10-11, ref. no. 119). While the conductive section 126 may be formed with a bi-stable layer 120 for ease of manufacturing the conductive section 126 functions simply as a conductor and does not function as a memory element.

The bi-stable layer 120 of the memory element 124 comprises a material that exhibits a bi-stable electrical resistance. Particularly, the bi-stable layer 120 comprises a conditioned transition metal oxide. For example, the bi-stable layer 120 can comprise a conditioned transition metal oxide perovskite such as chromium-doped strontium titanium oxide (Cr-doped $SrTiO_3$). Good results have been achieved in particular with strontium and/or barium titanium oxide $(Sr,Ba)TiO_3$, strontium zirconium oxide $SrZrO_3$, tantalum oxide $Ta_2O_5$, calcium niobium oxide $Ca_2Nb_2O_7$, praseodymium and/or calcium manganese oxide $(Pr,Ca)MnO_3$ and other transition metal oxides with perovskite or perovskite-like structures, each material doped preferentially with chromium, manganese, or vanadium. Further the materials described in the above-mentioned documents, incorporated herein by reference, are advantageously usable in a memory device of the present invention. The programmable electrical resistance of the bi-stable layer 120 allows information to be repeatedly stored and erased by passing current in one direction or the other from second conductive layer 122 to (or from) first conductive layer 118 through the bi-stable layer 120. The process of conditioning the bi-stable layer 120 such that it exhibits a bi-stable electrical resistance is discussed in greater detail with regard to the method of the present invention disclosed below.

Due to the essentially "U" shape of the single memory cells 100, the series 130 of single memory cells 100 of FIG. 1 may be connected with a cross point wire array 139. The cross point wire array 139 comprises first direction wires 136 connecting the second top electrical contacts 142 of the conductive sections 126 of the single memory cells 100 in the series 130 and second direction wires 138 connecting the first top electrical contacts 144 of the memory elements 124 of the single memory cells 100 in the series 130. The cross point wire array 139 allows the bi-stable layers 120 of the memory elements 124 within each single memory cell 100 in the series 130 to be addressed individually for storing information and also allows a block erase process to be used to simultaneously erase the information stored in the memory elements 124 of all of the single memory cells within the series 130.

Figure 2:
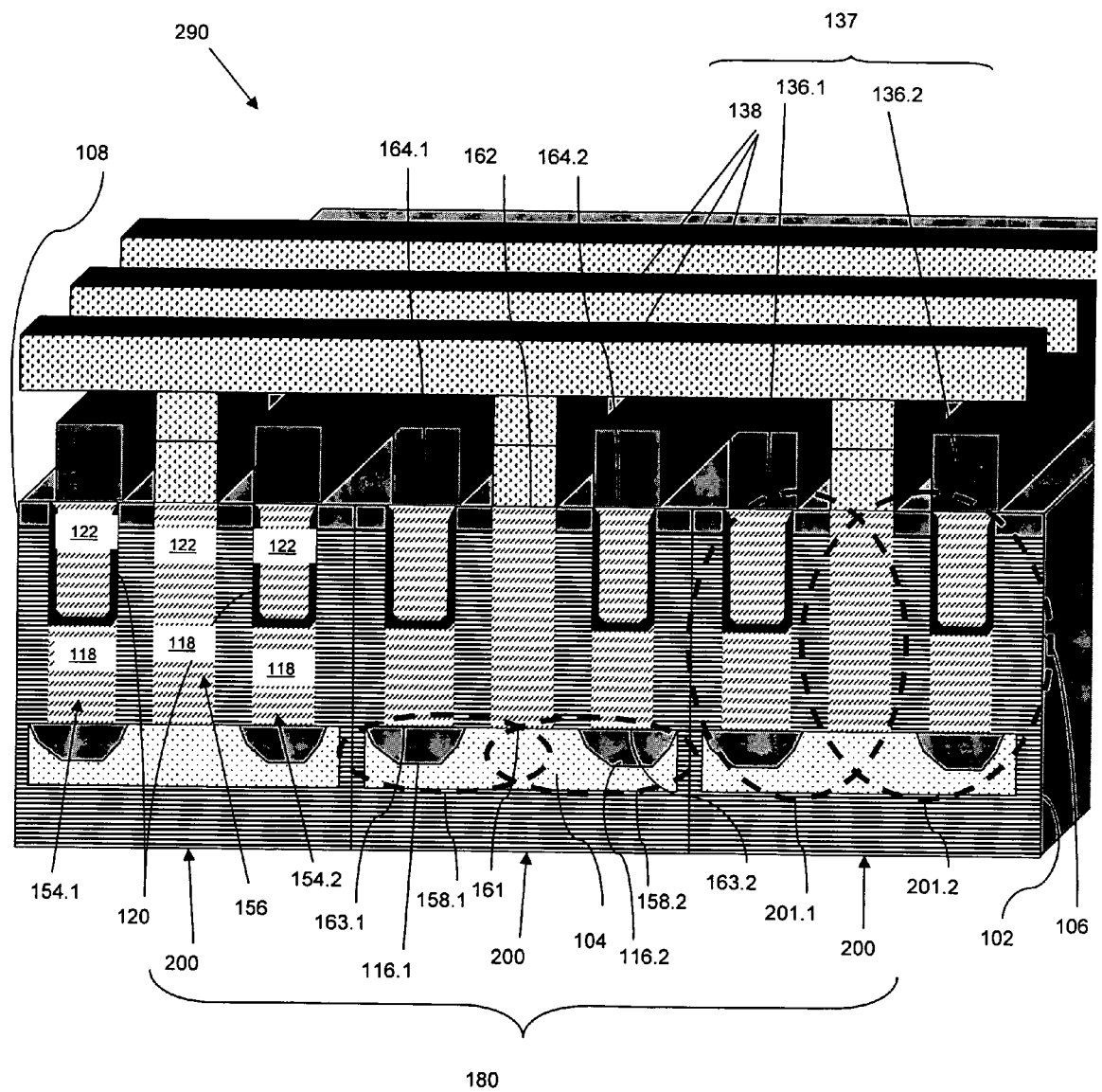
FIG. 2 is a schematic drawing illustrating another embodiment of a completed non-volatile memory device of the present invention
Figure 18:
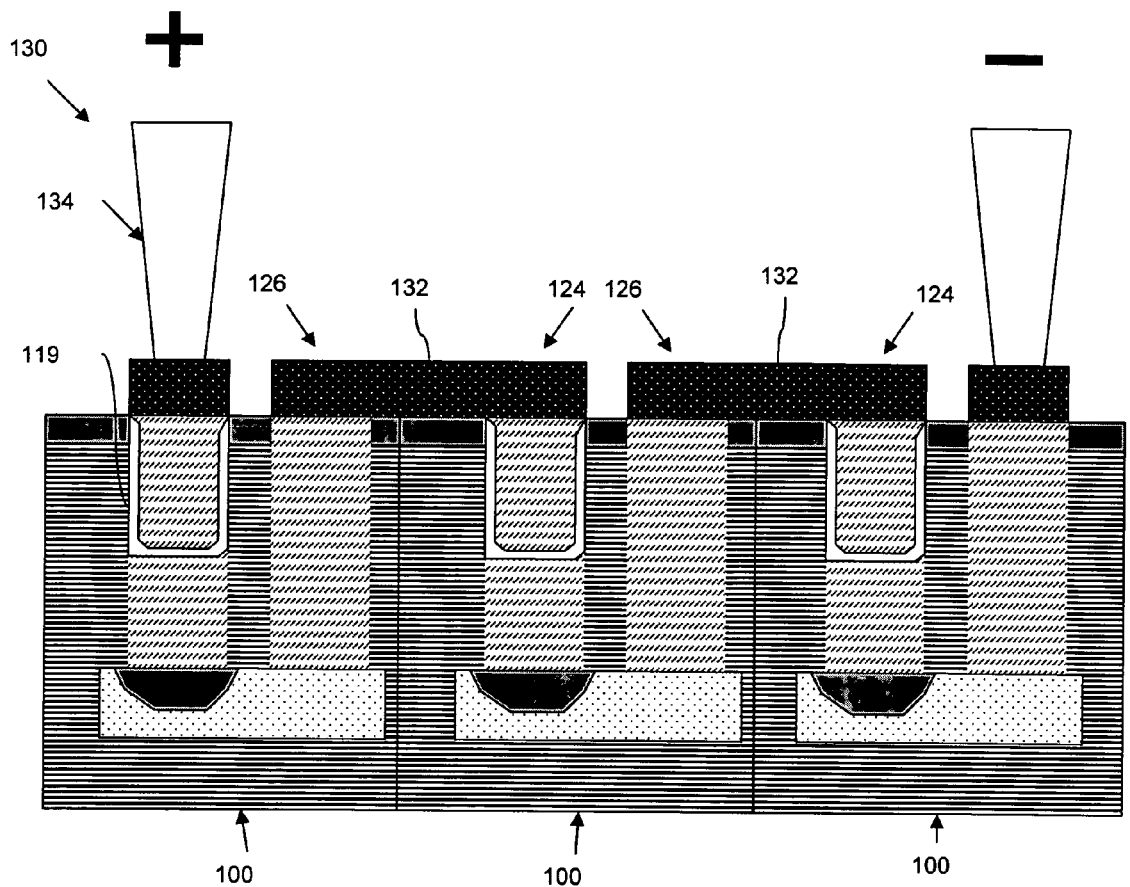

Referring to FIG. 2, another embodiment of a structure of a non-volatile memory device 290 comprises a series 180 of double memory cell structures 200. Each double memory cell 200 is isolated in the series 180 by insulating layers 102 and 106. The insulating layer 106 may be covered with a nitride layer 108. Each double memory cell structure 200 comprises two essentially "U" shaped memory cells 201.1, 201.2. Specifically, each double memory cell 200 comprises three physically-parallel sections including two first sections (i.e., first and second memory elements 154.1 and 154.2) and a shared conductive section 156 (i.e., shared conductive section 156). The first and second memory elements 154.1 and 154.2 each have a corresponding first and second top electrical contact 164.1, 164.2 and a first and second bottom surface 163.1; 163.2. The first and second memory elements 154.1, 154.2 each comprise a first conductive layer 118, a bi-stable layer 120 on the first conductive layer 118 and a second conductive layer 122 on the bi-stable layer 120. The conductive section 156 of the double memory cell 200 also has a third top electrical contact 162 and a third bottom surface 161. The conductive section 156 of the double memory cell 200 further comprises a conductive material. For example, the conductive section 156 may comprise conductive layers 118 and 122 (as illustrated in FIG. 2). Alternatively, the conductive section 156 may be formed in a similar manner as the two first sections 154.1, 154.2 (i.e., memory elements) with a bi-stable layer 120 between the conductive layers 118 and 122 (not illustrated in FIG. 2, see the partially completed structure of FIG. 18, ref. no. 119). While the conductive section 156 may be formed with a bi-stable layer 120 for ease of manufacturing the conductive section 126 functions only as a conductor and does not function as a memory element.

Conductors including two diodes 158.1, 158.2 (e.g., zener diodes) electrically connect the bottom surfaces 163.1, 163.2, respectively, of the first and second memory elements 154.1, 154.2 with the bottom surface 161 of the conductive section 156. Each diode 158.1, 158.2 is adapted to allow an electrical current to flow between the conductive section 156 and a corresponding first and second memory element 154.1, 154.2. The diodes (e.g., 158.1 and 158.2) each can comprises a first-type silicon section (e.g., 116.1 and 116.2) contacting a corresponding memory element 154.1, 154.2 and disposed within a second-type silicon section 104 contacting the conductive section 156.

Due to the essentially "U" shape of each of the two memory cells 201.1, 201.2 within each double memory cell 200, the series 180 of double memory cells 200 may be connected with a cross point wire array 137. The cross point wire array can comprise first direction wires 136.1 connecting the first top electrical contacts 164.1 of the first memory elements 154.1 of a plurality of cells 200 in the series 180, other first directions wires 136.2 connecting the second top electrical contacts 164.2 of the second memory elements 154.2 of a plurality cells 200 in the series 180, and second direction wires 138 connecting the third top electrical contacts 162 of the conductive sections 156 of a plurality of cells 200 in the series 180. The cross point wire array 137 allow the bi-stable layers 120 of each of the memory elements 154.1 and 154.2 in a double memory cell 200 to be addressed individually for storing information and allows a block erase process to be used to simultaneously erase the information stored in the memory elements 154.1, 154.2 of all the double memory cells 200 within the series 180.

As with the previously described structural embodiment, the bi-stable layer 120 of each of the memory elements 154.1, 154.2 comprises a material that exhibits a bi-stable electrical resistance. Particularly, the bi-stable layer 120 comprises a conditioned transition metal oxide. For example, the bi-stable layer 120 can comprise a conditioned transition metal oxide perovskite such as chromium-doped strontium titanium oxide (Cr-doped $SrTiO_3$) or the other materials discussed above. The programmable electrical resistance of the bi-stable layer 120 within the first and second memory elements 154.1 and 154.2 in each double memory cell 200 allows each double memory cell 200 to function as two separate memory cells 201.1 and 201.2. Thus, information can be repeatedly stored and erased from the bi-stable layer 120 within each memory cell 201.1 and 201.2 of the double memory cell 200. By sharing the conductive section 156 and the silicon island 104 (used to form the diodes 158.1 and 158.2 between two memory elements 154.1, 154.2 and the conductive section 156), this structural embodiment reduces the area required for two memory cells (e.g., 201.1 and 201.2, see FIG. 2) as compared to a single memory cell 100 (see FIG. 1).

Note that the shared conductive section may be shared by more than two memory elements, to assemble triple (or greater) memory cells. Fabrication and operation of these memory cells proceed in a manner like those for double cells, though additional levels of temporary wiring are required.

Figure 3:
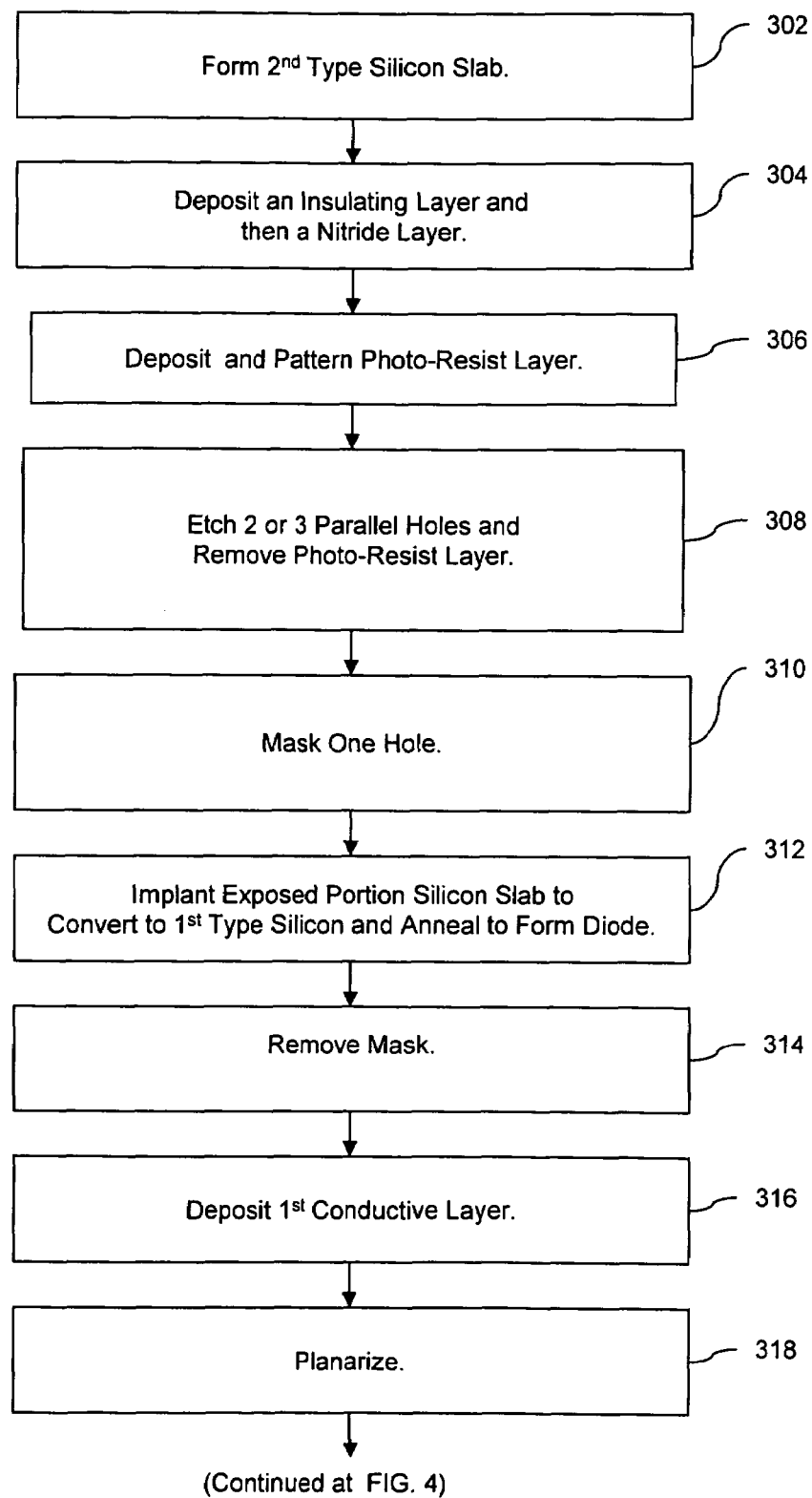
FIGS. 3-4 are a schematic flow diagram illustrating a method of forming the non-volatile memory device of the present invention.
Figure 4:
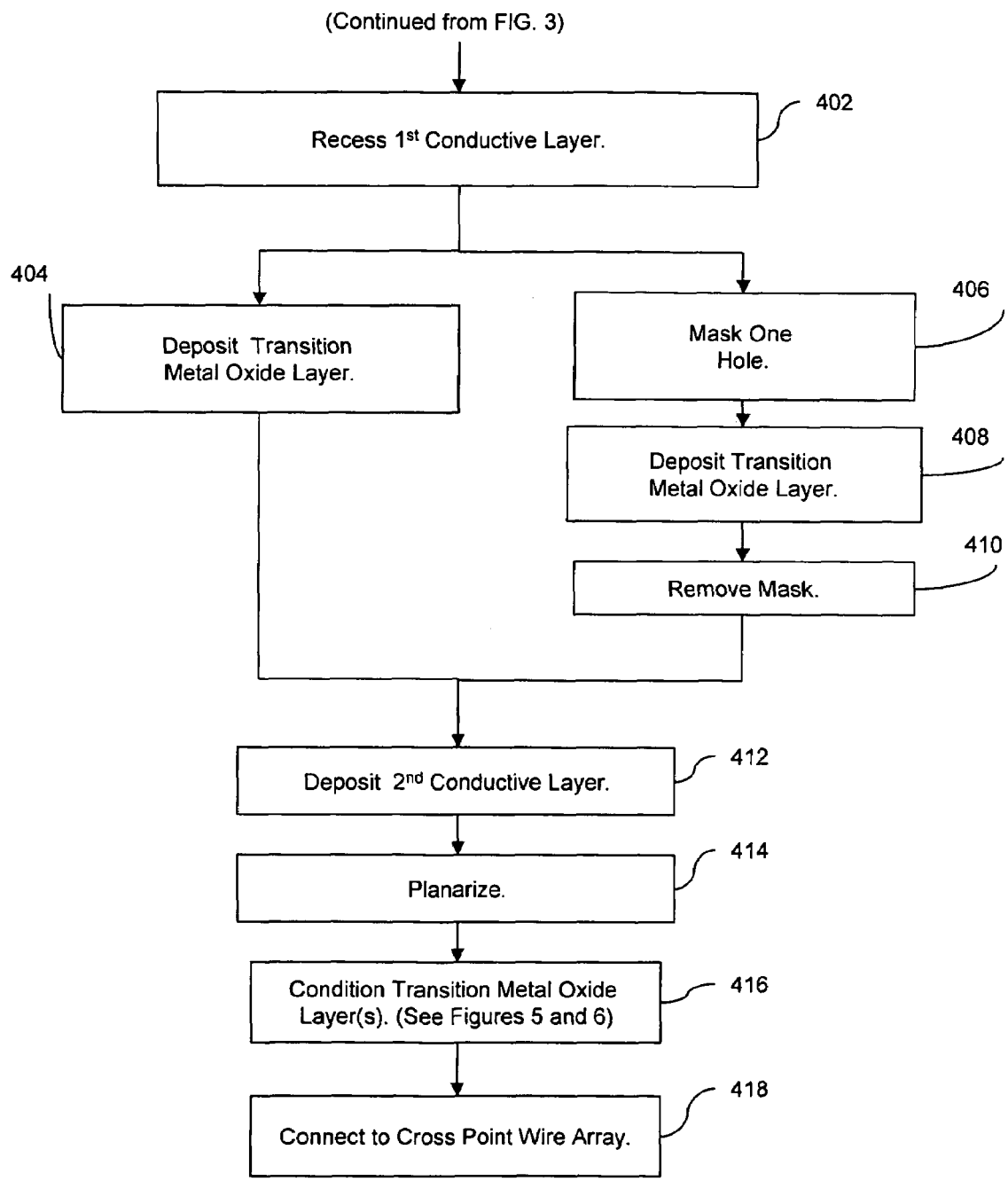
Figure 7:
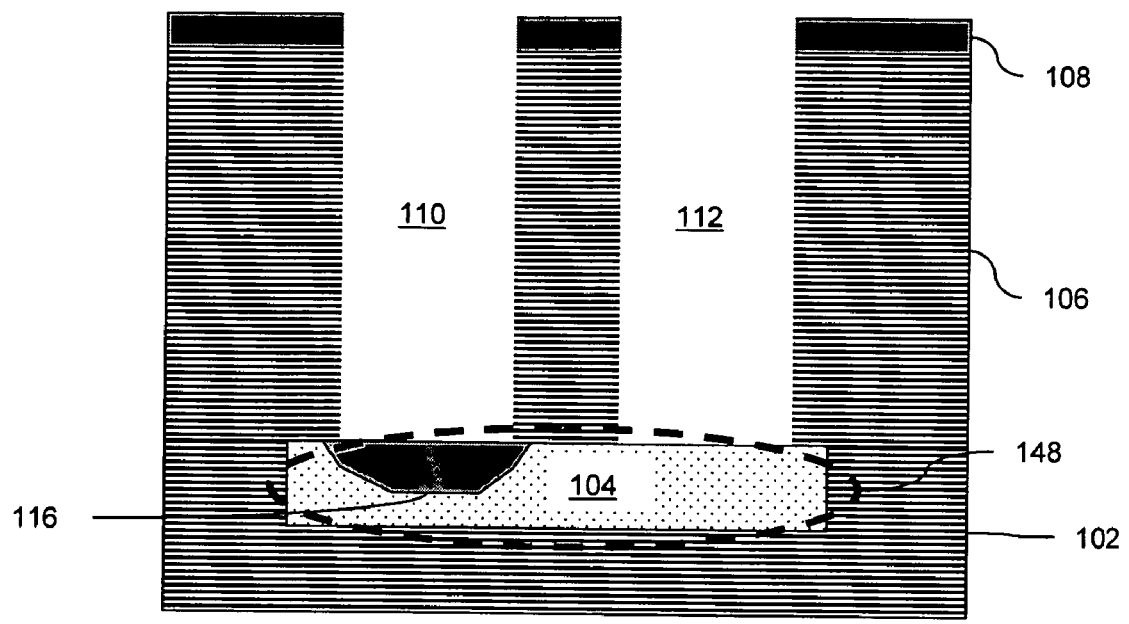
FIGS. 7-15 are schematic drawing illustrating partially completed single memory cells of the embodiment of FIG. 1.
Figure 20:
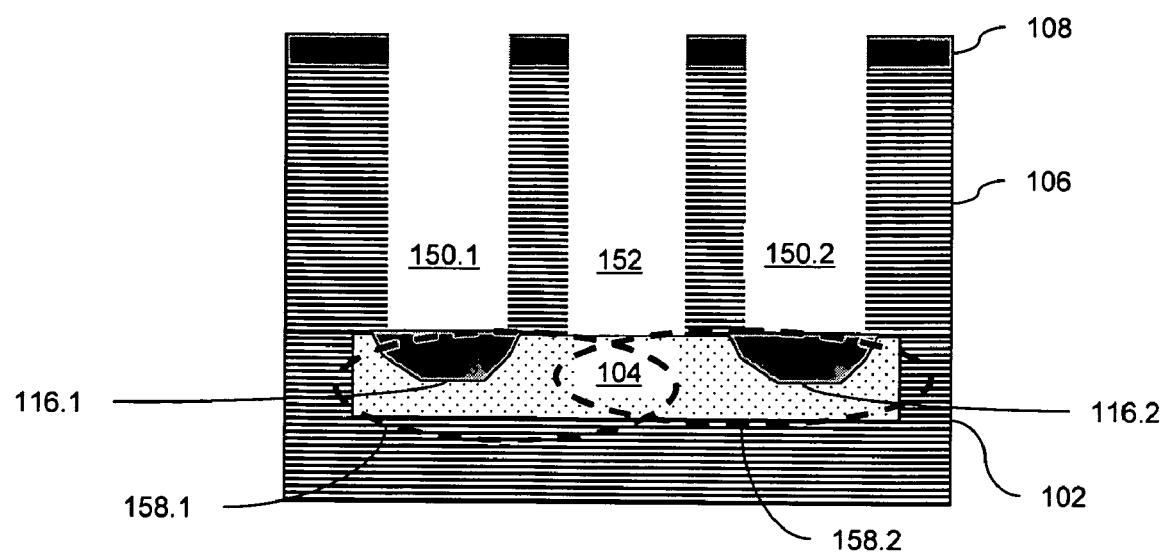
FIGS. 20-22 are schematic drawings illustrating partially completed double memory cells of the embodiment of FIG. 2

The flow diagram of FIGS. 3-4 illustrate embodiments of the methods of the forming the non-volatile memory device 190 comprising a series 130 of single memory cells 100 of FIG. 1 and of forming the non-volatile memory device 290 comprising a series 180 of double memory cells 200 of FIG. 2. To form either a single memory cell 100 or a double memory cell 200, a second-type silicon island or slab 104 can be formed within an insulating layer 102 (302). The second-type silicon island 104 is described herein as a p-type silicon but may alternatively be formed of an n-type silicon. The second-type silicon slab 104 can be formed by depositing a photo-resist layer over silicon of a silicon-on-insulator (SOI) wafer (alternatively, a bulk substrate may also be used). Then, shallow trench isolation (STI) structures are lithographically patterned onto the photo-resist layer and the STI structures are etched through the silicon to the buried oxide (BOX) layer 102 of the SOI wafer to form silicon islands 104. An STI oxide 102 is deposited over the silicon island and exposed portions of the BOX, and the STI oxide 102 is polished (e.g., by using chemical mechanical polishing (CMP) processes) to the original silicon surface to form a planar structure. This process would be used to form all array and non-array devices at the same time. At this point the silicon island 104 is implanted with an appropriate dopant (e.g., a boron implant for a p-type silicon or an arsenic or phosphorus implant for an n-type silicon, etc.) using conventional processing to convert the silicon island 104 to a second-type silicon. An anneal process is performed to activate the implanted dopant. Depending on the device 190, 290 design point, it is possible in some cases to postpone the activation anneals until later in the method process. A dielectric layer 106 (i.e., an insulating layer), such as silicon dioxide ($SiO_2$), is deposited over both the silicon island 104 (i.e., $2^{nd}$ type silicon) and the STI oxide 102 and, then, the dielectric layer 106 is covered with a polish stop dielectric layer 108 (i.e., a nitride layer) (304). A photo-resist layer is then deposited over the nitride layer 108 and lithographically patterned with two parallel holes 110, 112 to form a single memory cell 100 (see FIG. 7) or three parallel holes 150.1, 152, 150.2 (see FIG. 20) to form a double memory cell 200 (306).

The two holes (including first hole 110 and second hole 112) or three holes (including two first holes 150.1 and 150.2 and second hole 152) are etched through the nitride layer 108 and insulating layer 106 to expose corresponding portions of the second-type silicon island 104, and the photo-resist layer is removed (308). Then, the second hole (112 of FIG. 7 or 152 of FIG. 20 depending upon whether a single 100 or double 200 memory cell is being formed) is masked such that the first holes (110 of FIG. 7 or 150.1 and 150.2 of FIG. 20) are left exposed (310). The exposed portions of the second-type silicon 104 corresponding to the first holes (e.g., 110 of FIG. 7 or 150.1 and 150.2 of FIG. 20) are then implanted with an appropriate dopant to convert the exposed portions of the second-type silicon 104 into a first-type silicon (e.g., 116 of FIG. 7 or 116.1 and 116.2 of FIG. 20) and an anneal is performed (312). For example, for an n-type silicon arsenic, phosphorus, etc. can be implanted to convert the exposed portion(s) of second-type silicon 104 into a first-type silicon section 116 and an anneal is performed to activate the dopant. Once the first-type silicon (e.g., 116 of FIG. 7 or 116.1 and 116.2 of FIG. 20) is formed, the mask is removed to form the partially completed single memory cell of FIG. 7 or the partially completed double memory cell structure of FIG. 20 (314). Thus, completing the processes 302 through 314 can result in the formation of either a single diode 148 (e.g., a zener diode) comprising a first-type silicon section 116 disposed within a second-type silicon 104 (see FIG. 7) or, alternatively, two diodes 158.1 and 158.2 (e.g., zener diodes) each comprising a first-type silicon section 116.1 and 116.2, respectively, disposed within a shared second type silicon section 104. The diode 148 of FIG. 7 connects the first hole 110 with the second hole 112. The diodes 158.1, 158.2 of FIG. 20 each respectively connect a first hole 150.1, 150.2 with the second hole 152. These diodes (e.g., 148, 158.1, 158.2) are adapted to allow flow of electric current between the conductive material that will fill the first hole(es) 110 or 150.1 and 150.2 and the second hole 112, 152. The diodes and the method of forming the diodes described herein are exemplary in nature. Those skilled in the art will recognize that other diodes and/or methods of forming those diodes may be suitable for the purposes of the present invention.

Figure 8:
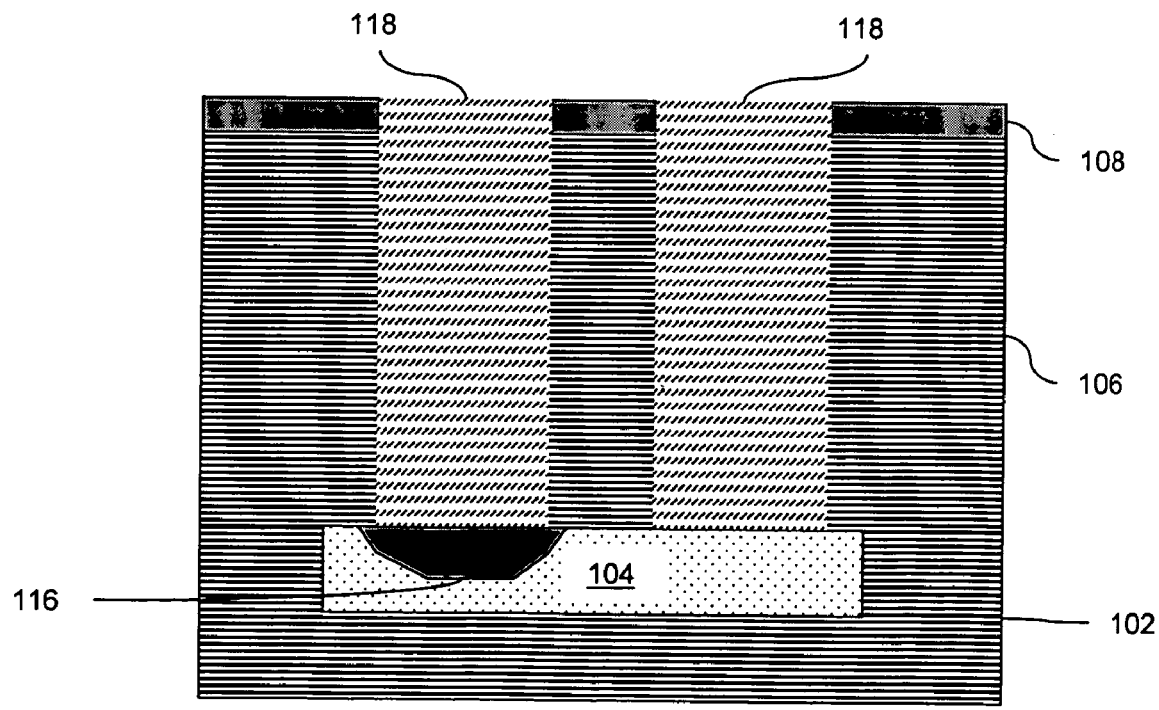
Figure 9:
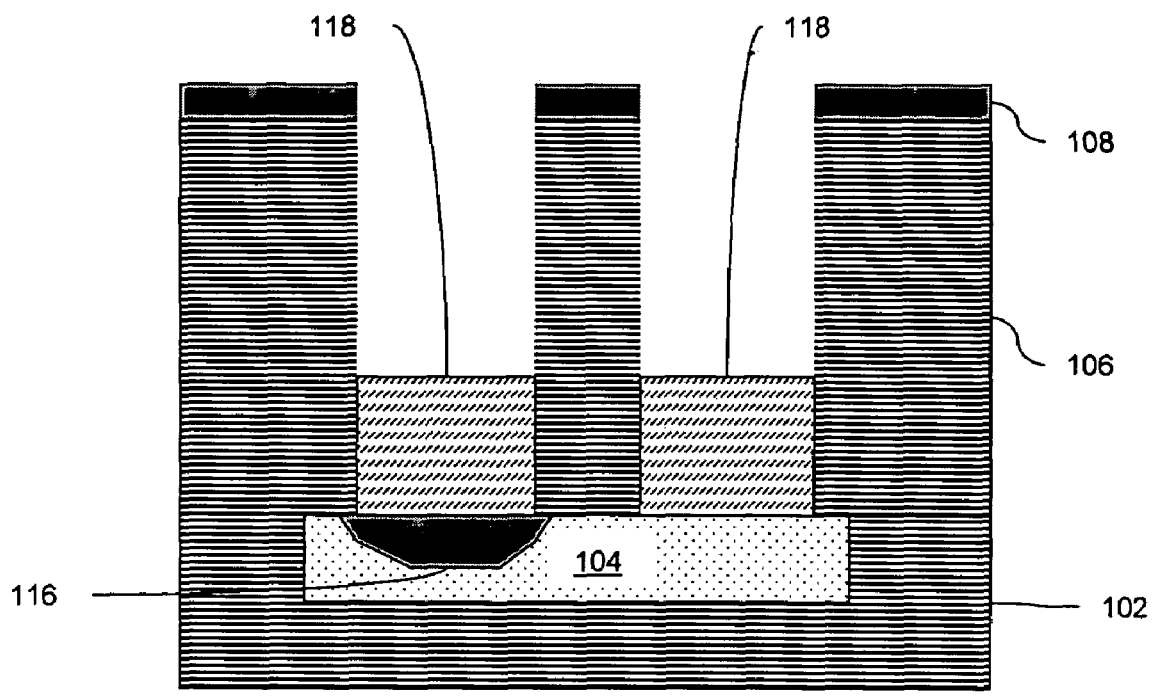

Once the holes are etched, a first conductive layer 118 (e.g., a conductive metal such as Tungsten) is deposited over the nitride layer 108 and into the first and second holes (316). Specifically, referring to FIG. 8, when forming a single memory cell 100, the first conductive layer 118 is deposited into the first hole 110 and into the second hole 112. Similarly, when forming a double memory cell 200, the first conductive layer 118 is deposited into the two first holes 150.1, 150.2 and into the second hole 152. Then, the first conductive layer 118 is planarized (e.g., using CMP processes) level with the nitride layer 108 (318). The first conductive layer 118 in each of the holes (e.g., first hole 110 and second hole 112 (see FIG. 9) or first holes 150.2, 150.2 and 152) are recessed (402). The recessing process 402 may be accomplished by reactive ion etching (RIE) processes.

Figure 12:
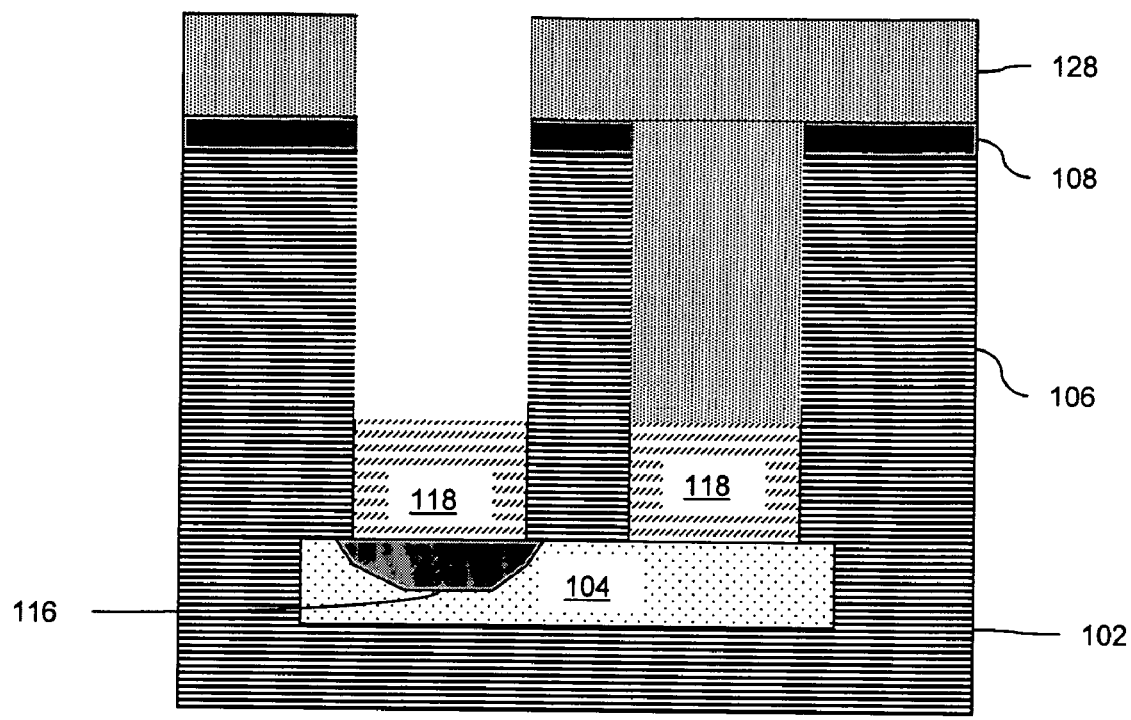
Figure 13:
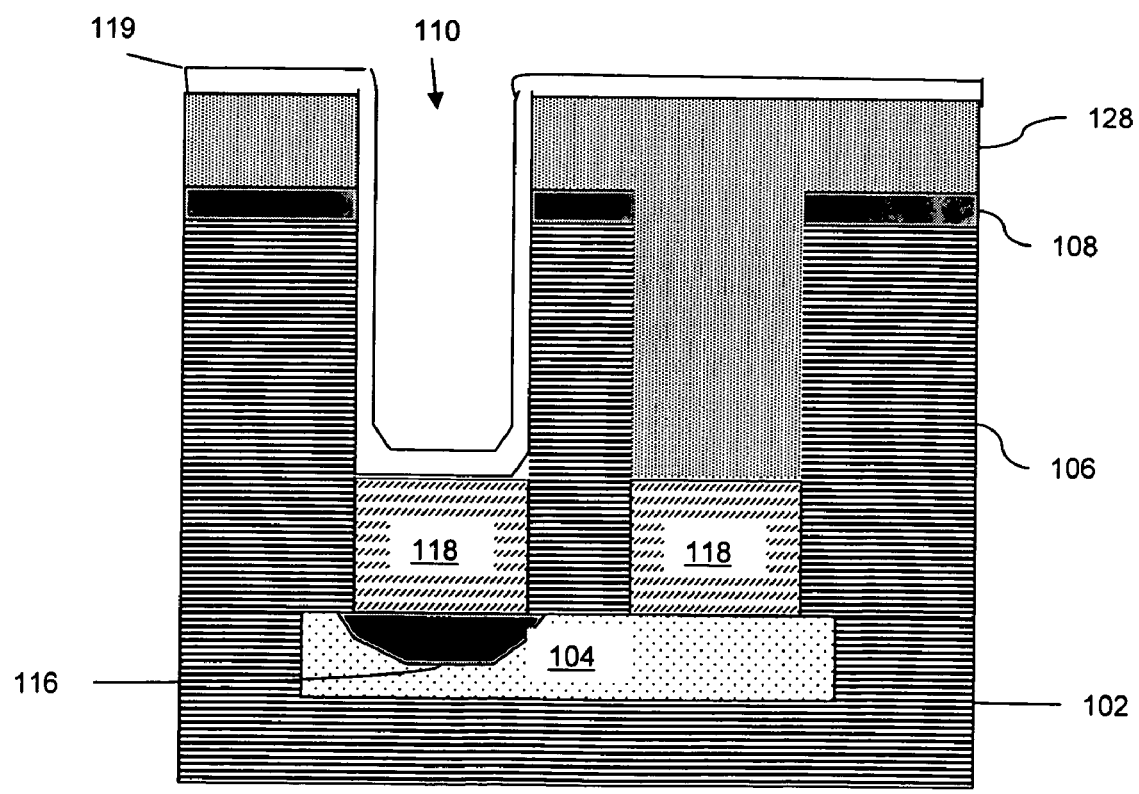
Figure 14:
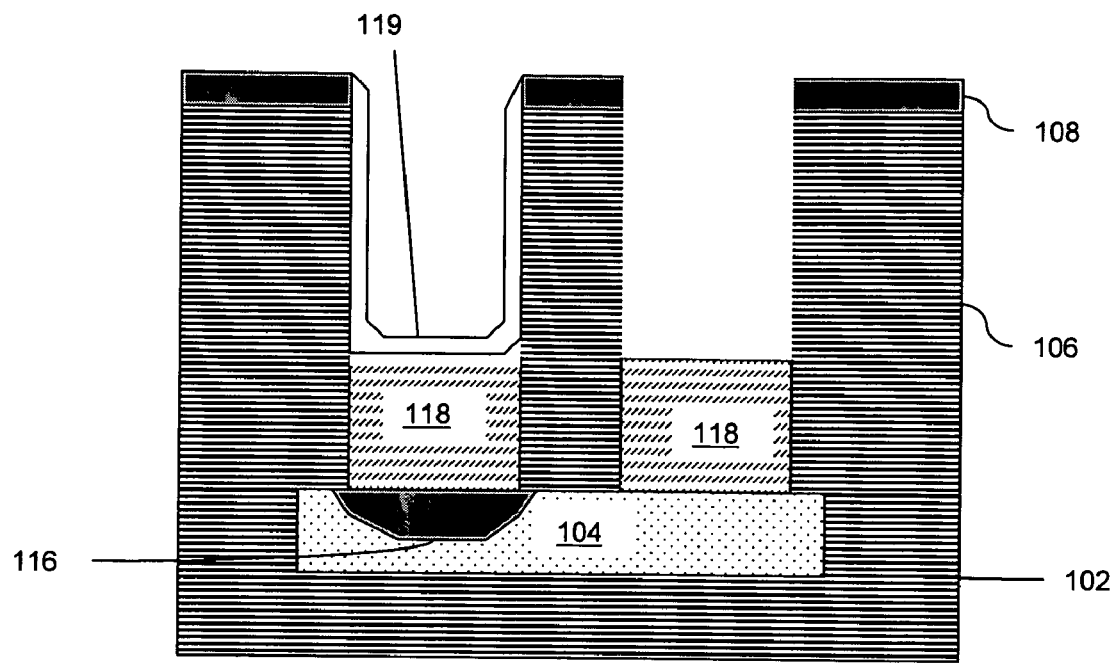
Figure 15:
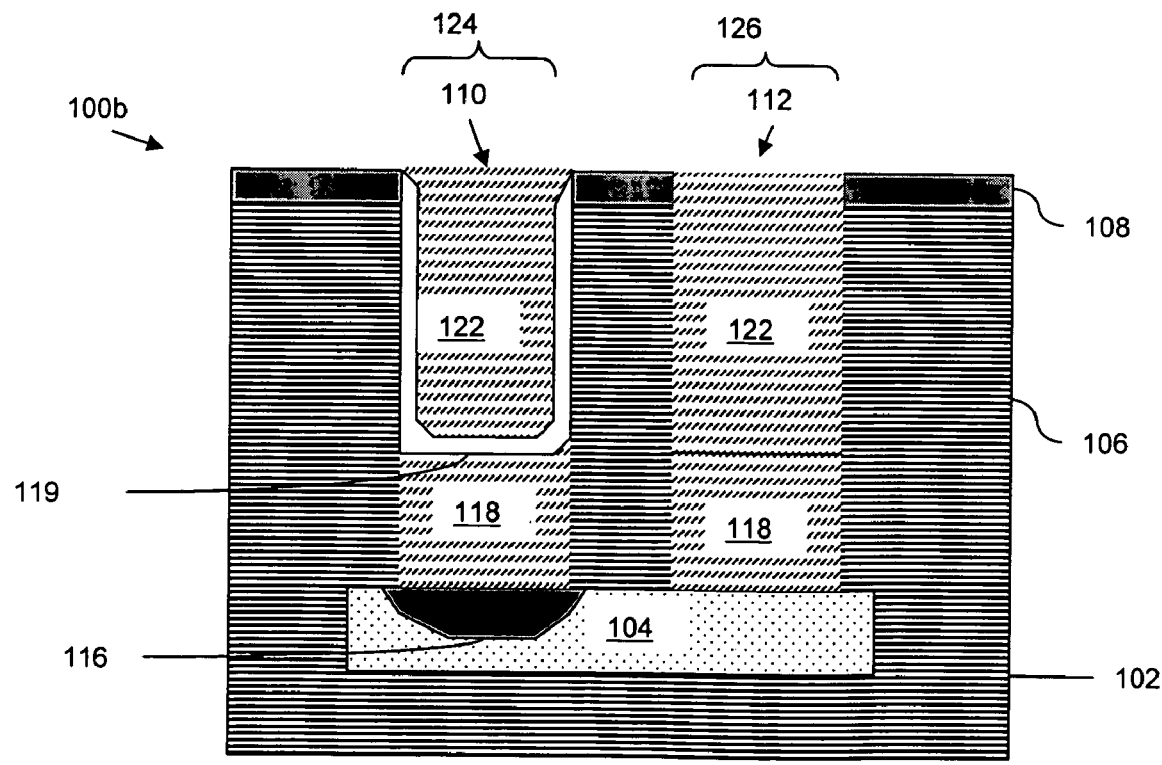
Figure 21:
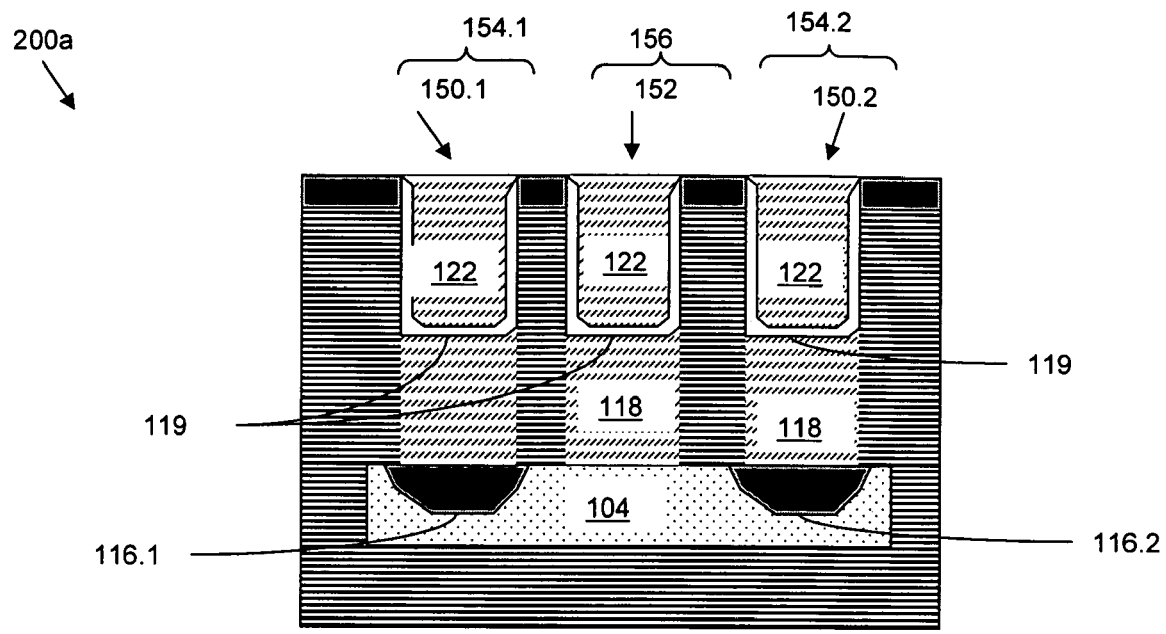
Figure 22:
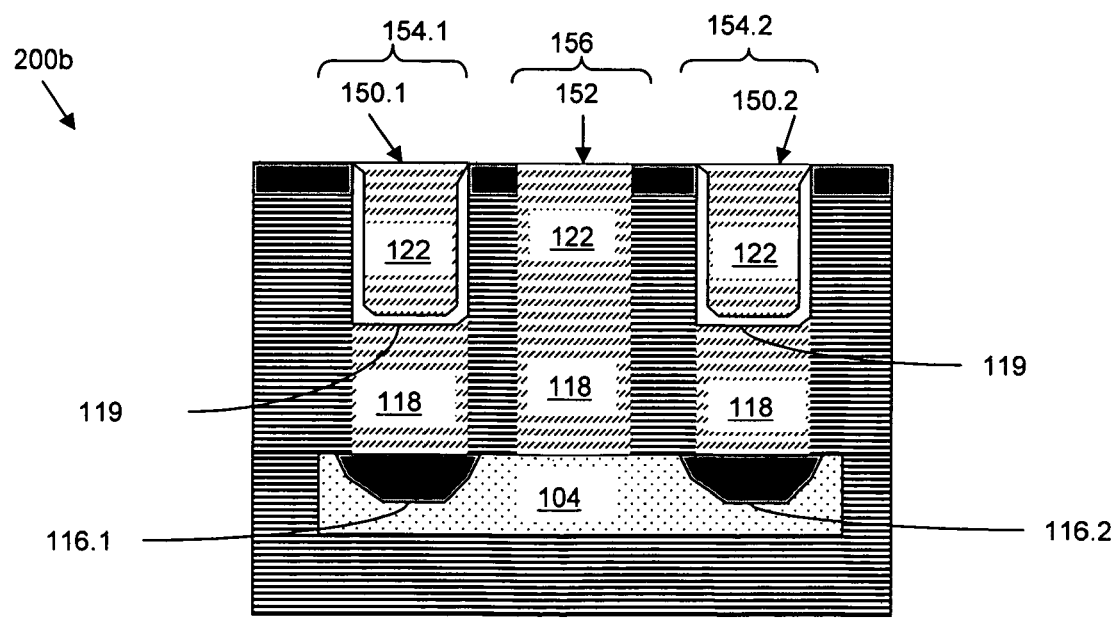

Referring to FIGS. 1 and 2, when forming either a single memory cell 100 or a double memory cell 200, the conductive section 126 or 156 is formed in the second hole 112 (see FIG. 7) or 152 (see FIG. 20), respectively. The conductive section 126 or 156 may be formed simultaneously with and be configured the same as for memory elements such that the conductive section also comprises a bi-stable layer 120 sandwiched between two conductive layers 118 (e.g., see FIGS. 9-11 of a single memory cell) and 122 (e.g., see FIG. 21 for a double memory cell). Alternatively, the conductive section 126 or 156 may be formed with only conductive material, for example, see conductive layers 118 and 122 of FIGS. 12-15 for a single memory cell and conductive layers 118 and 122 of FIG. 22 for a double memory cell. Regardless of how the conductive section 126 or 156 is configured, it functions only as a conductor and not as a memory element. If the conductive section 126 or 156 is formed in the same manner as a memory element, then after recessing the first conductive layer 118 at process 402, a conformal layer 119 of unconditioned transition metal oxide of appropriate thickness is deposited over the conductive layer 118 in all of the holes (404). For example, see the partially completed single memory cell 100 structure of FIG. 10. If the section 126 of a single memory cell 100 (or 156 of a double memory cell 200) is not to be formed with an unconditioned transition metal oxide layer 119, the second hole is masked prior to depositing the transition metal oxide layer 119 (406). For example, see the mask 128 of the partially completed single memory cell 100 structure of FIG. 12. Then, an unconditioned conformal transition metal oxide layer 119 of appropriate thickness is deposited on the exposed first conductive layers 118 in the first holes 110 (or 150.1, 150.2 for a double memory cell) (408). For example, FIG. 13 illustrates layer 119 deposited into only the first hole 110 of a single memory cell 100 structure in which the second hole 112 is masked. After depositing the transition metal oxide layer at process 408, the mask is removed (410, e.g., see FIG. 14), for example, by first planarizing to the nitride layer 108 and selectively etching to remove the mask material 128 from the second hole 126.

The unconditioned transition metal oxide layer 119 deposited at either process 404 or 408 can be a transition metal oxide perovskite or perovskite-like material. For example, the unconditioned transition metal oxide 119 can comprise chromium-doped strontium titanium oxide (Cr-doped $SrTiO_3$). As discussed above, with regard to the structures of the present invention, good results have been achieved in particular with strontium and/or barium titanium oxide (Sr, Ba)$TiO_3$, strontium zirconium oxide $SrZrO_3$, tantalum oxide $Ta_2O_5$, calcium niobium oxide $Ca_2Nb_2O_7$, praseodymium and/or calcium manganese oxide (Pr,Ca)$MnO_3$ and other transition metal oxides with perovskite or perovskite-like structures, each material doped preferentially with chromium, manganese or vanadium. Further the materials described in the above-mentioned documents, incorporated herein by reference, are advantageously usable in a memory device of the present invention. Deposition of the transition metal oxide layer 119 may be accomplished by sputtering or other methods and materials deposited on the sidewalls of the contact openings do not need to be removed because the as-deposited transition metal oxide is an insulator.

A second conductive layer 122 (e.g., Tungsten) is deposited into the two or three holes (412). For example, referring to the partially completed single memory cell 100a of FIG. 11 and 100b of FIG. 15, respectively, the second conductive layer 122 may be deposited over transition metal oxide layers 119 in both the first and second holes 110, 112 or over a transition metal oxide layer 119 in the first hole 110 and over the first conductive layer 118 in the second hole 112. Similarly, referring to the partially completed double memory cell 200a of FIG. 21 and 200b of FIG. 22, respectively, the second conductive layer 122 may be deposited over the transition metal oxide layers 119 in both the two first holes 150.1, 150.2 and second hole 152 or over transition metal oxide layers 119 in the two first holes 150.1, 150.2 and over the first conductive layer 118 in the second hole 152. Using a CMP process, the second conductive layer 122 is polished to the level of the nitride layer 108 (414).

The above-described processes can be used to form one or more different partially completed single memory cell 100 structures and one or more different partially completed double memory cell 200 structures. Each single memory cell 100 is essentially "U" shaped. Each double memory cell 200 comprises two essentially "U" shaped memory cells. Four cell embodiments include a single memory cell 100a of FIG. 11, a single memory cell 100b of FIG. 15, a double memory cell 200a of FIG. 21, and a double memory cell 200b of FIG.

22. As discussed earlier, while the conductive sections 126 and 156 of the single memory cell 100a and the double memory cell 200a, respectively, may be configured with a transition metal oxide layer 119 that is simultaneously conditioned along with the memory elements 124 and 154.1, 154.2, respectively, these conductive sections 126 and 156 function simply as conductors and not as memory elements.

Figure 29:
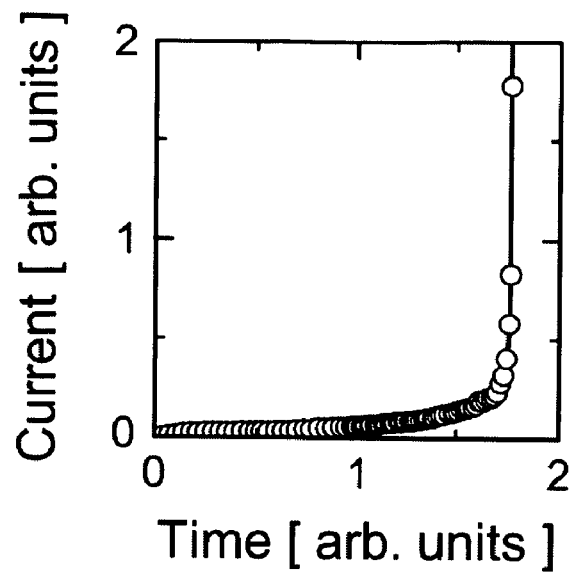
FIG. 29 is a graph illustrating the conditioning process of a transition metal oxide; and, FIG. 30 is a graph illustrating the bi-stable electrical resistance of a conditioned transition metal oxide.
Figure 30:
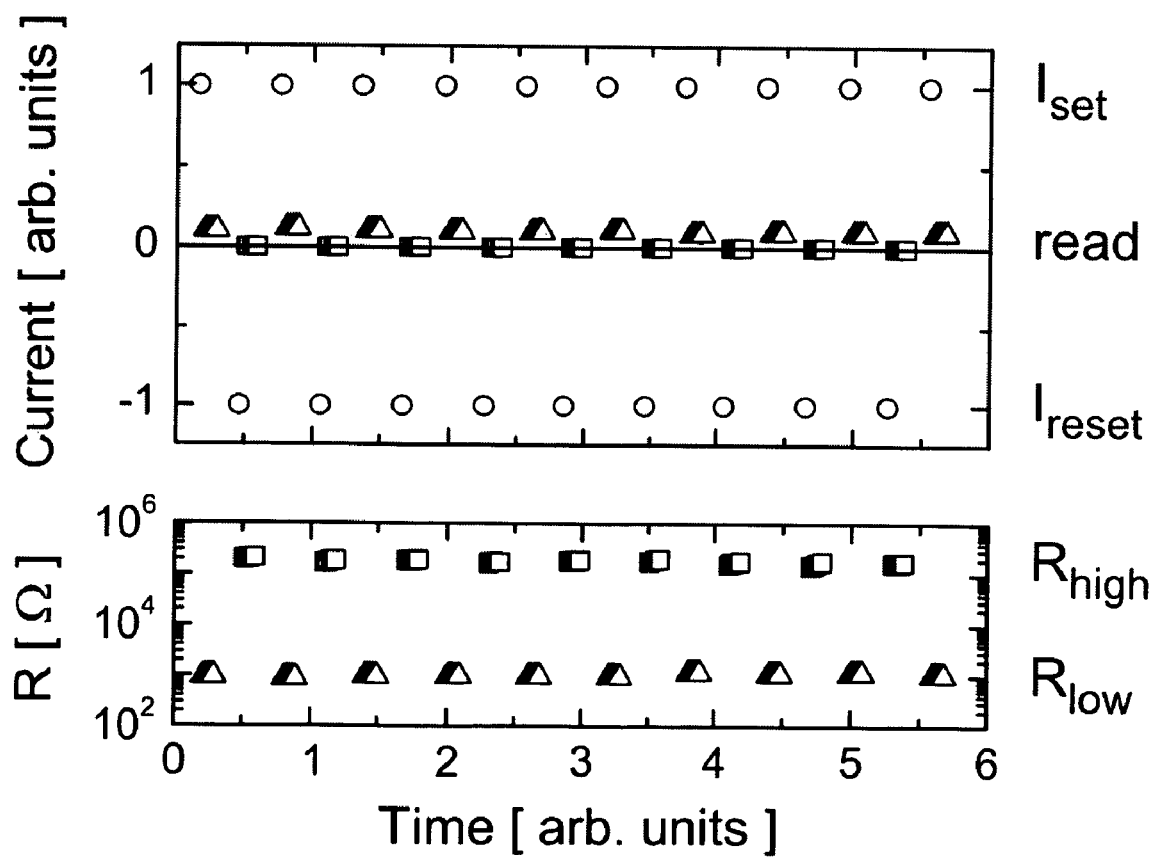

In order for the memory devices 190, 290 of the present invention to function, the memory elements (i.e., memory element 124 of a single memory cell 100 or memory elements 154.1, 154.2 of a double memory cell) and, specifically, the transition metal oxide layer 119 of the memory elements 124, 154.1, 154.2, must be conditioned to exhibit a desired bi-stable electrical resistance (i.e., to convert the unconditioned layer 119 into a programmed bi-stable layer 120) (416). The conditioning process (416) comprises subjecting the transition metal oxide layer 119 to an appropriate electrical current for a sufficient period of time to allow the transition metal oxide layer to exhibit a bi-stable electrical resistance. For example, conditioning process for Cr-doped $SrTiO_3$ comprises applying a moderately high electrical field of 0.1 V/nm for a conditioning time of typically between 1 and 60 minutes, as illustrated in the conditioning process graph of FIG. 29. This conditioning converts the unconditioned transition metal oxide layer 119 into a bi-stable layer 120 having a bi-stable electrical resistance: a state with a relatively high resistance (e.g., approximately 100 kilo-ohm) and a state with a relatively low resistance (e.g., approximately 1 kilo-ohm), as illustrated in bi-stable electrical resistance graph of FIG. 30.

Figure 5:
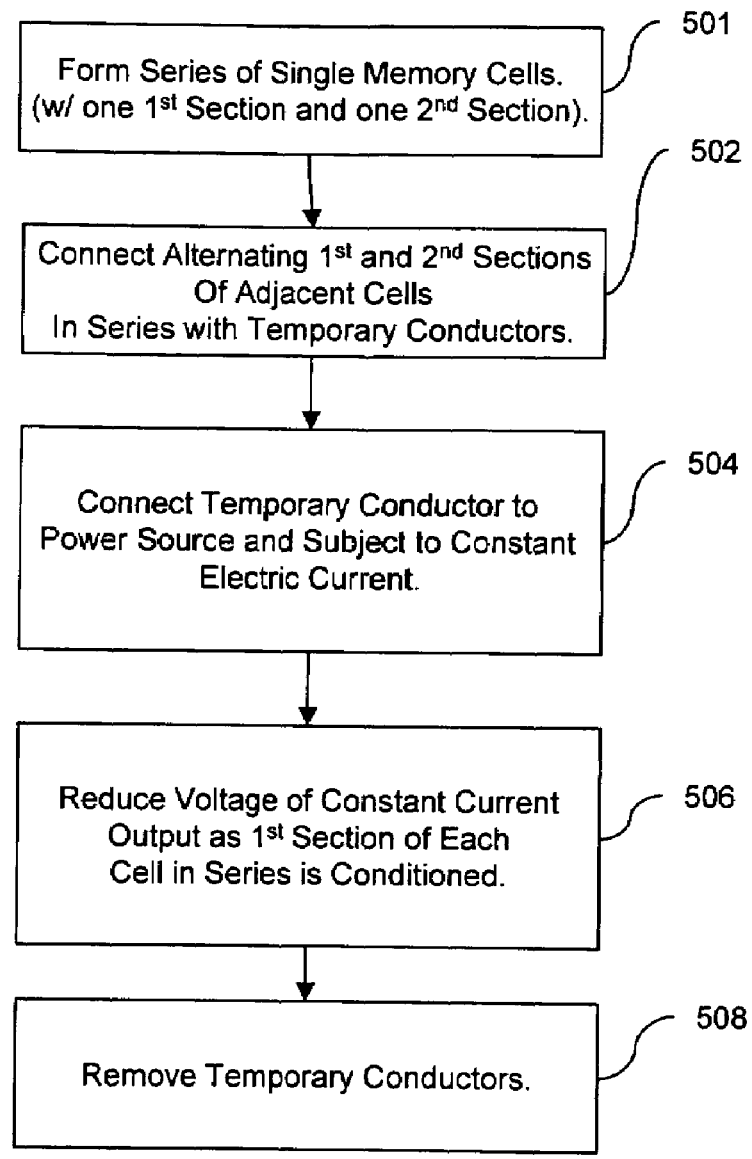
FIG. 5 is a schematic flow diagram illustrating the simultaneous conditioning process 416 for a series of single memory cells.
Figure 6:
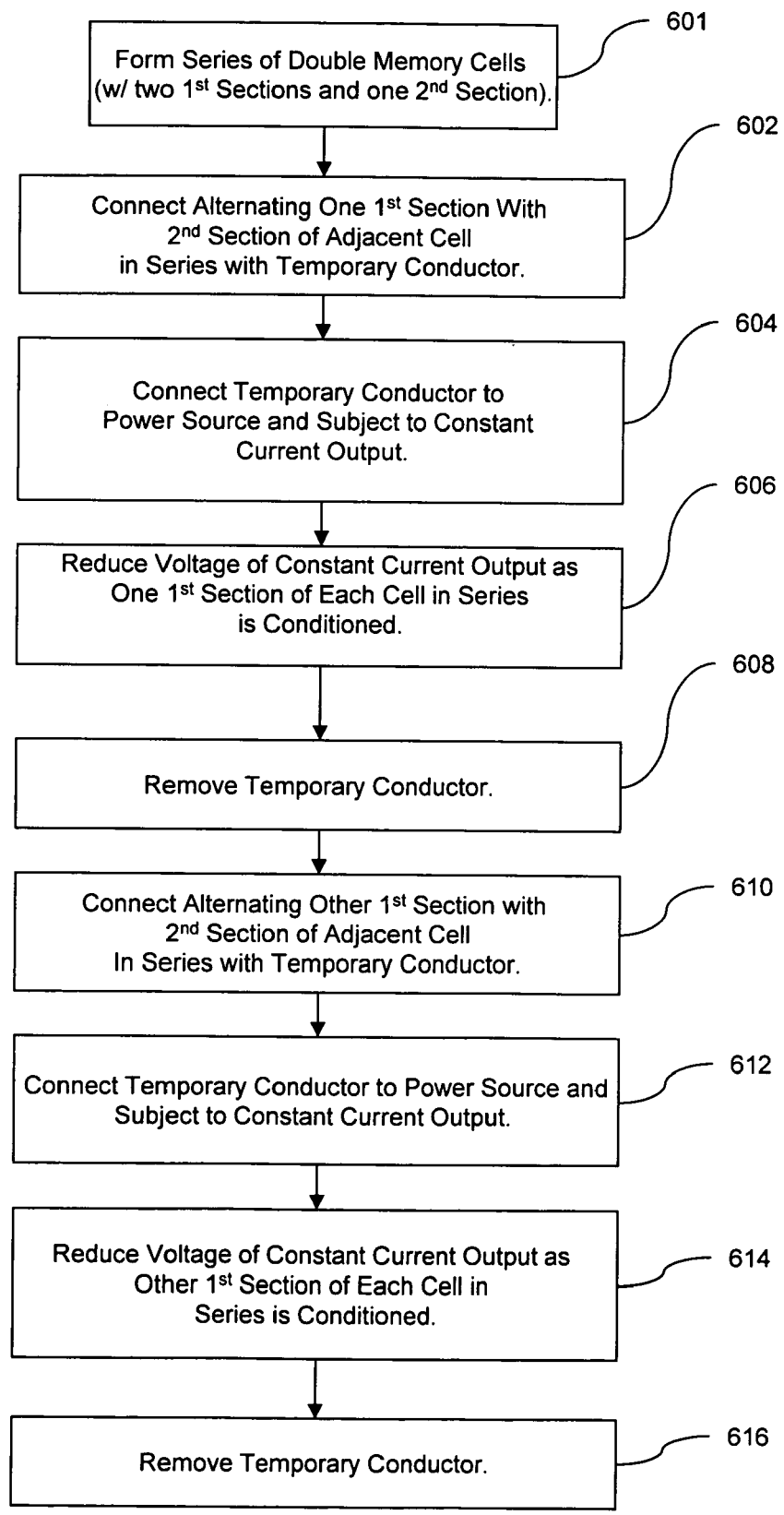
FIG. 6 is a schematic flow diagram illustrating the simultaneous conditioning 416 for a series of double memory cells.
Figure 16:
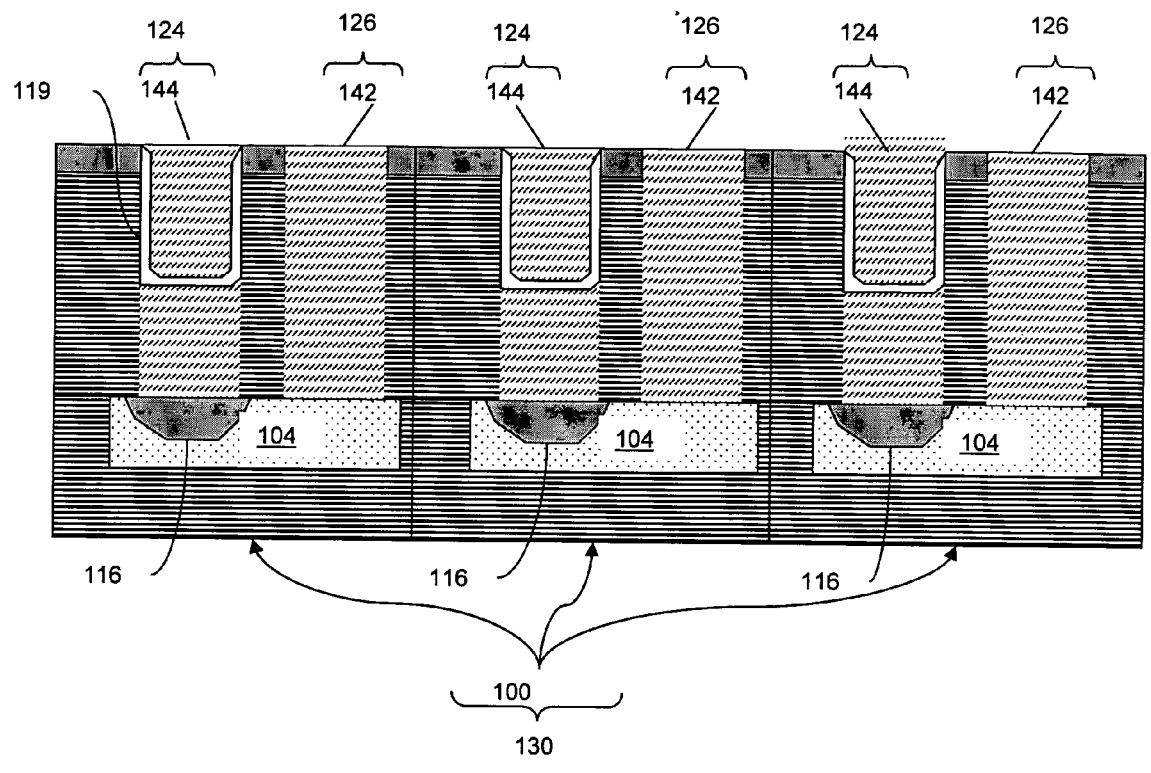
FIG. 16 is a schematic drawing illustrating a series of partially completed single memory cells of the embodiment of FIG. 1.
Figure 17:
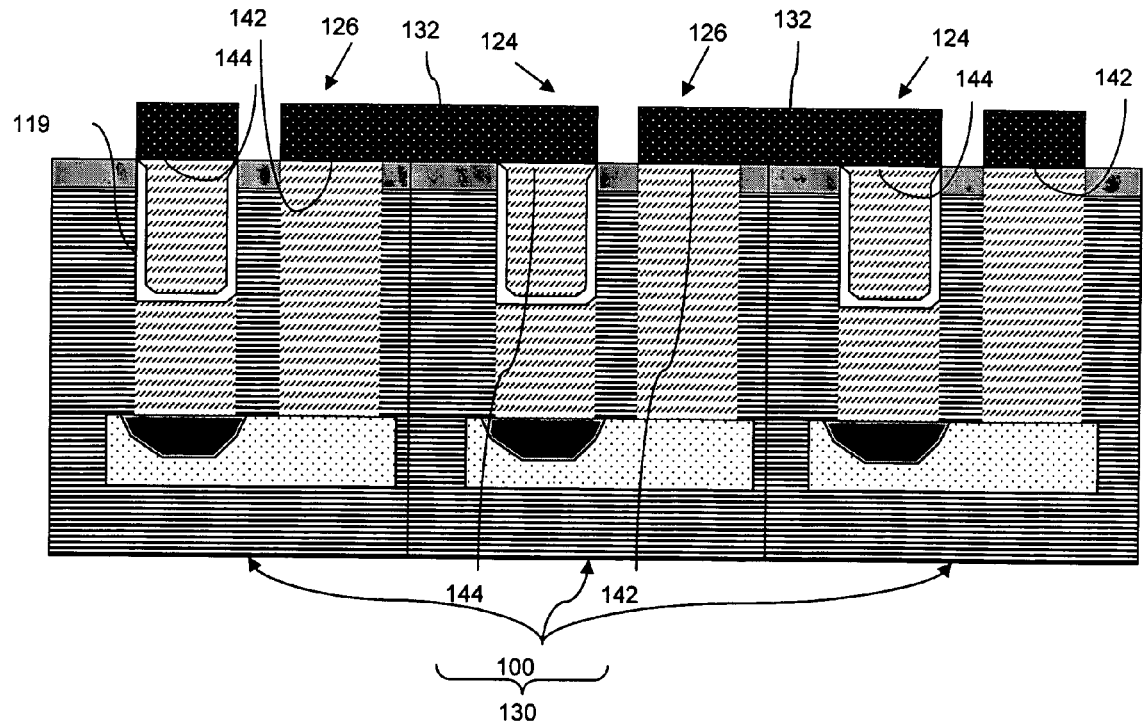
FIGS. 17-18 are schematic drawings illustrating the process of conditioning the structure of FIG. 13.
Figure 19:
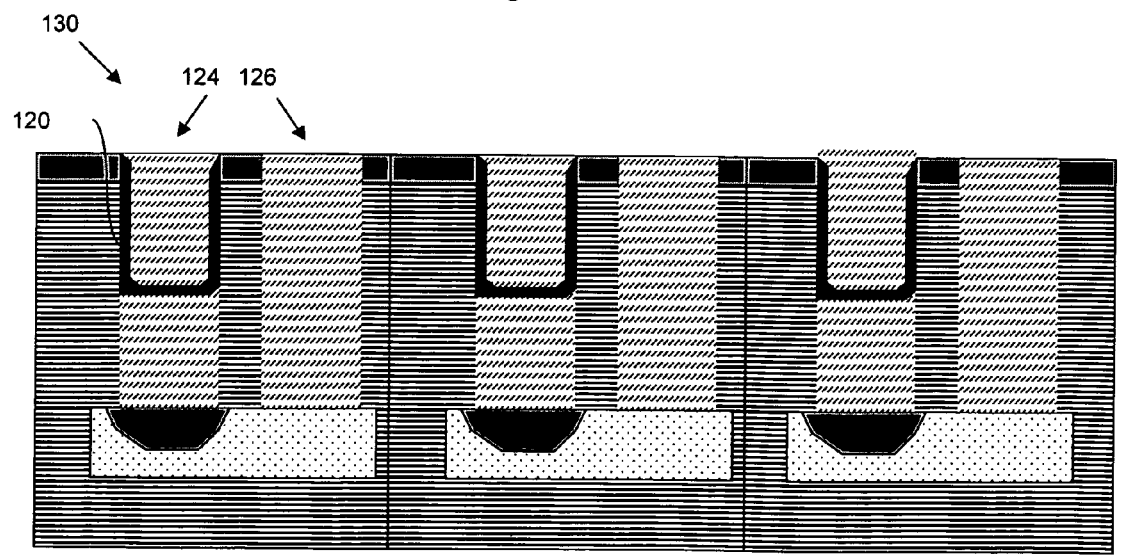
FIG. 19 is a schematic drawing illustrating partially completed non-volatile memory devices of FIG. 1.

Referring to the flow diagrams of FIGS. 5 and 6, the unconditioned transition metal oxide layers 119 of the memory elements of the single memory cells 100 or double memory cells 200 of a semiconductor device 190, 290 may be conditioned in bulk (i.e., simultaneously) due to the "U" shape of the memory cells. Referring to the flow diagram of FIG. 5, to simultaneously condition single memory cells 100, a plurality of single memory cells 100 may be formed into a series 130 (501, see exemplary series 130 of FIG. 16). The transition metal oxide layer 119 in the first sections 124 (i.e., memory elements 124) of multiple single memory cell structures 100 in a series 130 are conditioned simultaneously by connecting alternating first top electrical contacts 144 of the memory elements 124 to second top electrical contacts 142 of the conductive sections 126 of adjacent single memory cells 100 in the series 130 with a temporary conductor 132 (502, see FIG. 17). This can be accomplished by depositing a suitable conductive material (e.g., aluminum) over the series 130 of single memory cells 100. A photo-resist layer is deposited over the conductive material 132 and is lithographically patterned with spaces corresponding to the areas between adjacent series and between each memory element 124 and conductive section 126 of each memory cell 100. This pattern is etched through the conductive material, thereby directly connecting the alternate first and second top electrical contacts 144, 142 of adjacent cells in the series 130. The temporary conductor 132 is then connected at an end of the series 130 with a probe to a power source 134 adapted to output an electrical current through the plurality of single memory cells 100 in the series 130 (504, see FIG. 18). An appropriate electrical current is output from the power source 134 through the single memory cells 100 in the series 130 via the temporary conductor 132. As the unconditioned transition metal oxide layers 119 of each of the memory elements 124 of each single memory cell 100 in the series 130 are conditioned and the electrical resistance drops, the voltage output of the power source 134 is reduced (506) to prevent the transition metal oxide layers 119 which have been programmed to exhibit the desired resistances (i.e., bi-stable layers 120) from receiving an excessive current. Note that the order of conditioning of memory elements within the series may be random. Once the unconditioned transition metal oxide layers 119 of all of the single memory cells 100 in the series 130 are conditioned to exhibit the desired resistance (i.e., converted into programmed bi-stable layers 120), the temporary conductor 132 is removed (508, see FIG. 19).

Figure 23:
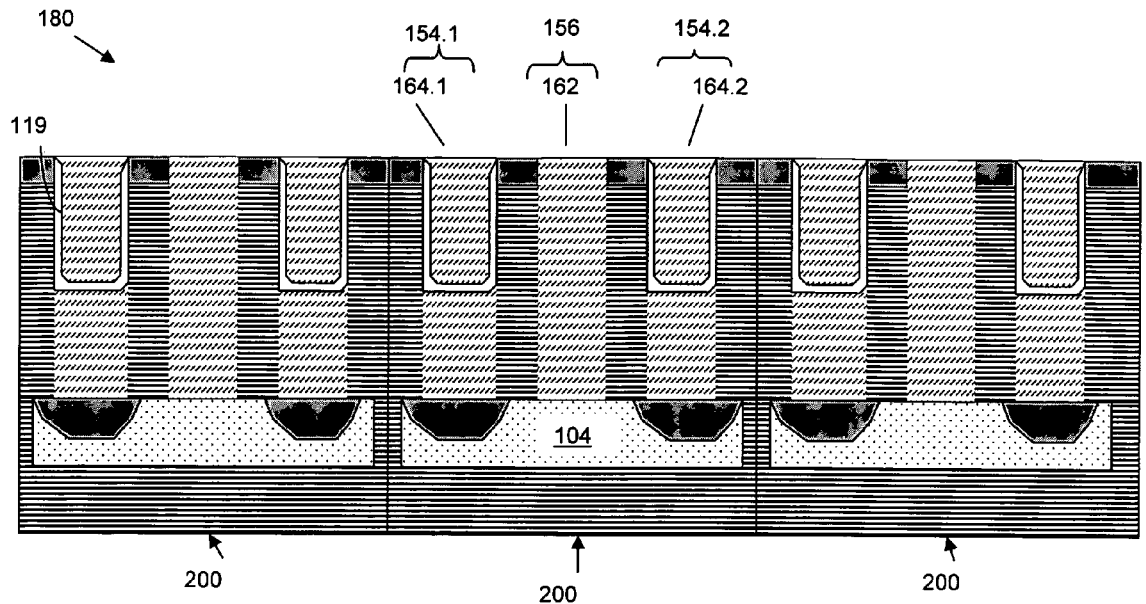
FIG. 23 is a schematic drawing illustrating a series of partially completed double memory cells of the embodiment of FIG. 2.

Referring to the flow diagram of FIG. 6, to simultaneous condition double memory cells 200, a plurality of double memory cells 200 may be formed simultaneously in a series 180 (601, see exemplary series 180 of FIG. 23). The conditioning process for the unconditioned transition metal oxide layers 119 of a series 180 of double memory cell structures 200 comprises a two phase conditioning process because there are two separate "U" shaped memory cells 201.1, 201.2 in each double memory cell 200 (as illustrated in FIG. 2). Each memory cell 201.1, 201.2 has a separate first section 154.1, 154.2 (i.e., first and second memory elements) and shares a conductive section 156. The first and second memory elements 154.1, 154.2 are each electrically connected to the conductive section 156 by a conductor including a diode 158.1, 158.2 associated with each memory element 154.1, 154.2. Each diode 158.1, 158.2 can include a separate first-type silicon section 116.1, 116.2 in contact with a corresponding memory element 154.1, 154.2. The first-type silicon sections 116.1, 116.2 can be disposed within a shared second-type silicon section 104. Thus, the unconditioned transition metal oxide layer 119 of each memory element 154.1, 154.2 associated with memory cell 201.1, 201.2 of a double memory cell 200 must be conditioned separately.

Figure 24:
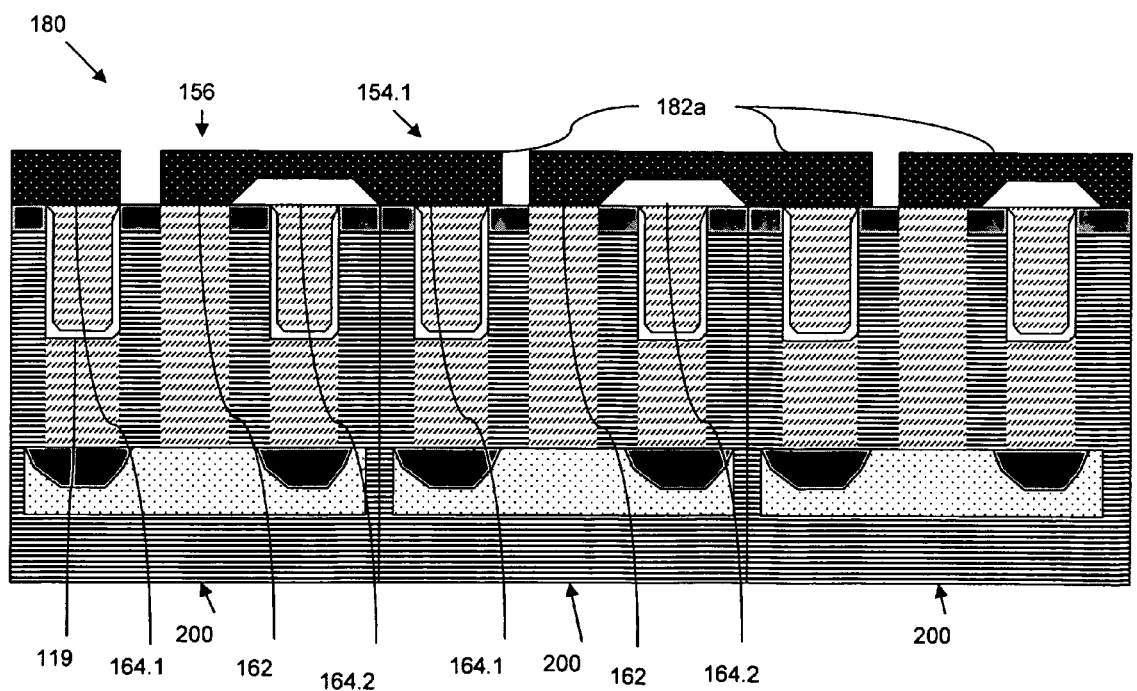
FIGS. 24-25 are schematic drawings illustrating the first stage of the process of conditioning the structure of FIG. 21.
Figure 25:
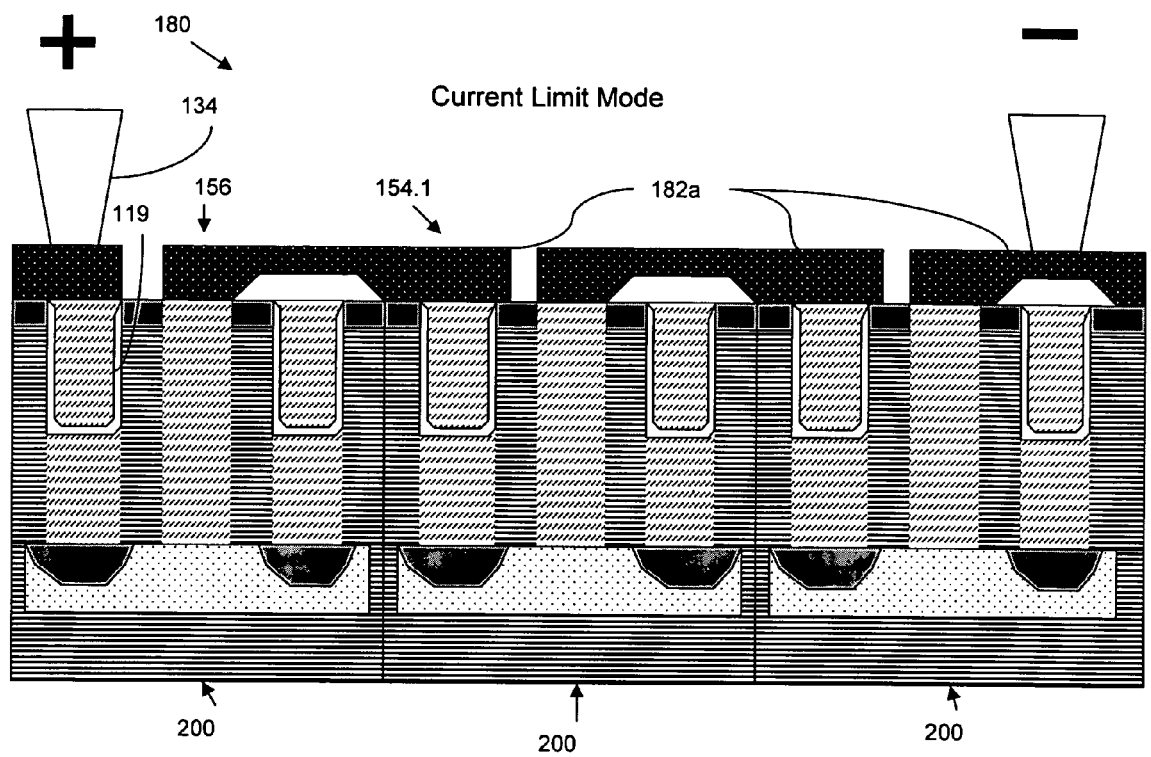
Figure 26:
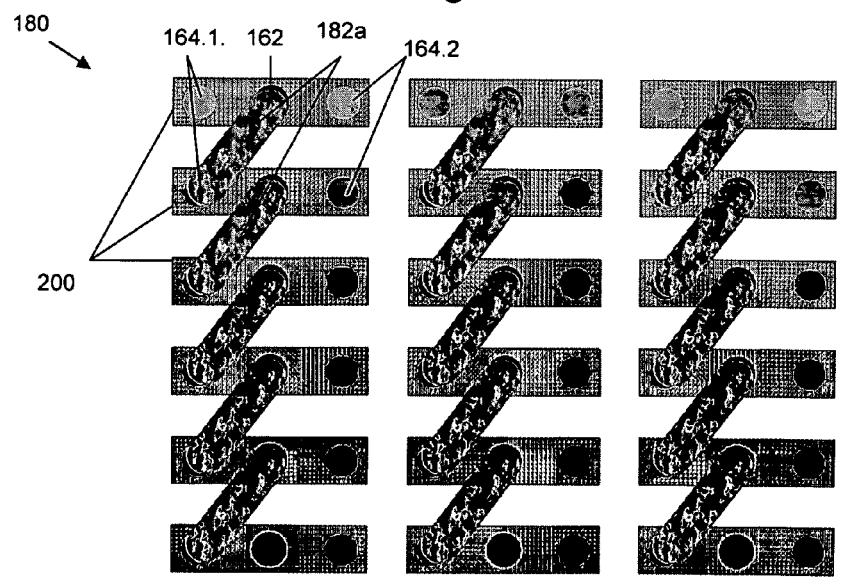
FIG. 26 is a schematic top view drawing illustrating the first stage of the process of conditioning the structure of FIG. 21.

During the first phase of the conditioning process, all of the first memory elements 154.1 of each double memory cell structure 200 in a series 180 may be conditioned simultaneously (602-608). During the second phase of the conditioning process, all of the second memory elements 154.2 of each double memory cell 200 in the series 180 are conditioned simultaneously (610-616). The first stage of the conditioning process comprises connecting the first top electrical contacts 164.1 of first memory elements 154.1 to the third top electrical contact 162 of the conductive sections 156 of adjacent double memory cells 200 in the series 180, in an alternating manner, with a temporary conductor 182a (502, see FIGS. 24 and 26). This can be accomplished, for example, by depositing a suitable conductive material (e.g., aluminum) over the series 180 of double memory cells 200. A photo-resist layer is deposited over the conductive material and double memory cells 200. The photo resist layer is lithographically patterned such that, upon etching, conductive material will only be left connecting the first top electrical contact 164.1 of first memory elements 154.1 of each double memory cell 200 in the series 180 with a third top electrical contact 162 of an adjacent conductive section 156 of another double memory cell 200 in the series 180. The temporary conductor 182a is then connected at an end of the series 180 with a probe to a power source 134 adapted to output an electrical current through the plurality of double memory cells 200 in the series 180 (604). An appropriate electrical current is output from the power source 134 through the double memory cells 200 in the series 180 via the temporary conductor 182a (604). As the unconditioned transition metal oxide layers 119 of each of first memory elements 154.1 of the double memory cells 200 in the series 180 are conditioned and the electrical resistance drops, the voltage output of the power source is reduced (606) to prevent the already conditioned first memory elements 154.1 from receiving an excessive current. Note that the order of conditioning of memory elements in the series may be random. Once the transition metal oxide layers 119 of all of first memory elements 154.1 in the series 180 are conditioned (i.e., are converted into programmed bi-stable layers 120 that exhibit a desired resistance), the temporary conductor 182a is removed (608).

Figure 27:
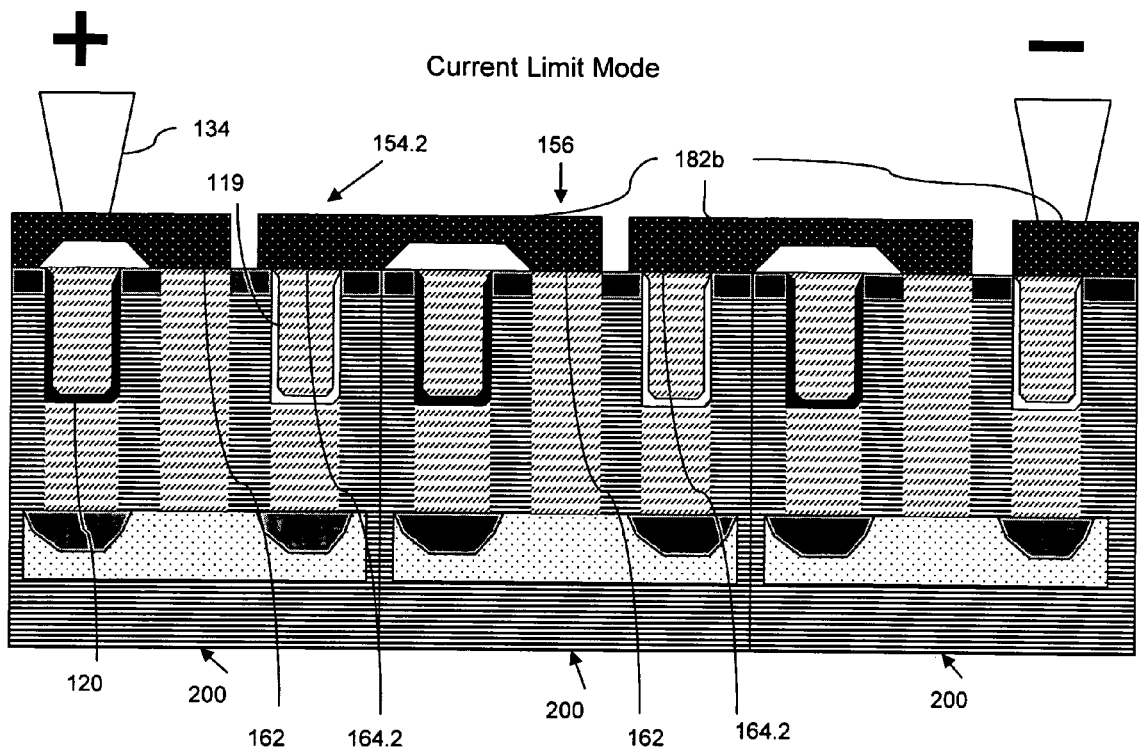
FIG. 27 is a schematic drawing illustrating the second stage of the process of conditioning the structure of FIG. 21.
Figure 28:
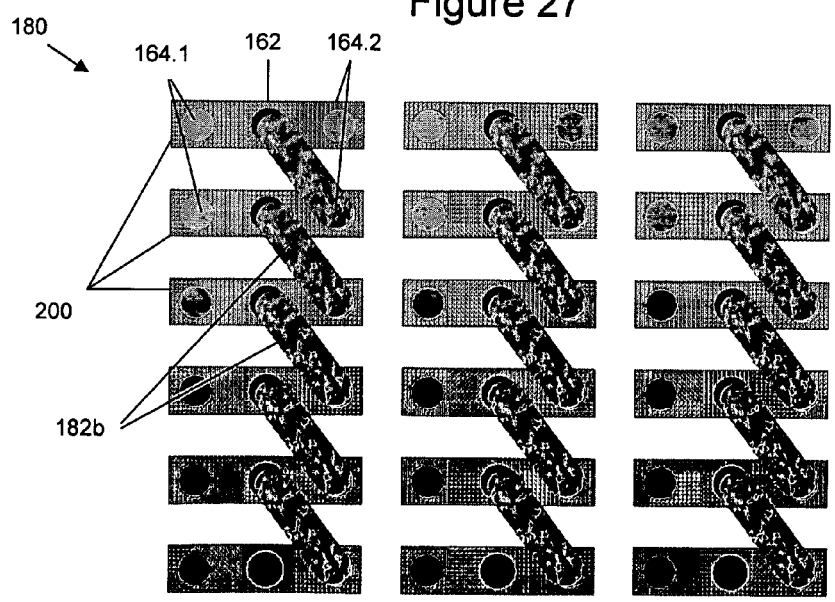
FIG. 28 is a schematic top view drawing illustrating the second stage of the process of conditioning the structure of FIG. 21

Similarly, the second stage of the conditioning process comprises connecting the second top electrical contacts 164.2 of all of the second memory elements 154.2 and the third top electrical contacts 162 of the conductive sections 156 of adjacent double memory cells 200 in the series 180, in an alternating manner, with a temporary conductor 182b (610, see FIGS. 27-28). This can be accomplished by depositing a suitable conductive material (e.g., aluminum) over the series 180 of double memory cells 200. A photo-resist layer is deposited over the conductive material and memory cells. The photo-resist layer is lithographically patterned such that, upon etching, conductive material will only be left connecting the second top electrical contacts 164.2 of the second memory elements 154.2 of each double memory cell 200 with the third top electrical contacts 162 of the conductive sections 156 of adjacent memory cells 200 in the series 180. The temporary conductor 182b is then connected at an end of the series 180 with a probe to a power source 134 adapted to output an electric current through the plurality of double memory cells 200 in the series 180 (612). An appropriate electric current is output from the power source 134 through the double memory cells 200 in the series 180 via the temporary conductor 182b (612). As the transition metal oxide layers 119 of each of the second memory elements 154.2 in the series 180 are conditioned and the electrical resistance drops, the voltage output of the power source is reduced (614) to prevent the already conditioned second memory elements 154.2 from receiving an excessive current. Once transition metal oxide layers 119 of all of the second memory elements 154.2 in the series 180 are conditioned, converting them into bi-stable layers 120, the temporary conductor 182b is removed (616).

Referring again to the flow diagram of FIG. 4, once the simultaneous conditioning processes 416 for either the series 130 of single memory cells 100 or the series 180 of double memory cells 200 are completed, the memory cells 100, 200 in the respective series 130, 180 may be electrically connected (e.g., via a cross point wire array) (418). Due to the "U" shape of the single memory cells 100 in the series 130, the cells 100 may be connected via a cross point wire array 139 (see the completed structure 190 of FIG. 1). To form a cross point wire array 139 for a series 130 of single memory cells 100, first direction wires 136 are used to connect the second top electrical contacts 142 of the conductive sections 126 in one direction. Then second direction wires 138 are used to connect the first top electrical contacts 144 of the memory element 124 (i.e., first sections 124) in another direction. Similarly, due to the "U" shape of each of the memory cells 201.1, 201.2 in the double memory cells 200, the double memory cells 200 of series 180 may also be connected via a cross point wire array 137 (see completed structure 290 of FIG. 2). To form a cross point wire array 137 for a series 180 of double memory cells 200, first direction wires 136.1 are used to connect the first top electrical contacts 164.1 of the first memory elements 154.1 of a plurality of cells 200 in the series 180 and first direction wires are also used to connect the second top electrical contacts 164.2 of the second memory elements 154.2 of a plurality of cells 200 in the series 180 in the same direction. Second directions wires 138 are used to connect the third top electrical contacts 162 of the conductive sections 156 in another direction. The wires used to form the cross point wire arrays 139 and 137 are formed of a suitable conductive material that is ideally capable of withstanding a high-temperature fabrication process (e.g., aluminum copper, tungsten, etc.). The cross point arrays 139, 137 are configured such that each individual memory element (e.g., first section 124 of a single memory cell 100 or both the first sections 154.1 and 154.2 of a double memory cell 200) is capable of being uniquely identified and uniquely selected.

Therefore, disclosed above are non-volatile memory devices and the associated fabrication methods. Particularly, non-volatile memory devices are disclosed that incorporate a series of single memory cells or double memory cells. The single memory cells are essentially "U" shaped. The double memory cells comprise two essentially "U" shaped memory cells. Each memory cell comprises a memory element having a bi-stable layer sandwiched between two conductive layers. The bi-stable layer of each memory element is formed with an unconditioned transition metal oxide material which must be conditioned to exhibit a desired bi-stable resistance. Due to the "U" shape of the cells, a temporary conductor may be used to bulk condition a series of cells. Also, due to the "U" shape of the cells, a cross point wire array may be used to connect a series of cells. The cross point wire array allows the memory elements of each cell to be individually identified and addressed for storing information and also allows for the information stored in the memory elements in all of the cells in the series to be simultaneously erased using a block erase process.

What is claimed is:

1. An integrated circuit structure comprising:
   a single memory cell comprising:
      a memory element having a first top electrical contact and a first bottom surface, wherein said memory element comprises:
         a first conductive layer;
         a bi-stable layer on said first conductive layer, wherein said bi-stable layer comprises a material with a bi-stable, programmable, electrical resistance and wherein said programmable electrical resistance of said bi-stable layer is adapted to allow information to be repeatedly stored in and erased from said memory element; and
         a second conductive layer on said bi-stable layer;
      a conductive section having a second top electrical contact and a second bottom surface and comprising a conductive material, wherein said conductive section is parallel to said memory element and wherein said bottom surface of said memory element is electrically connected to said bottom surface of said conductive section;
   a series of said single memory cells separated by an insulating material; and
   a cross point wire array connecting said single memory cells in said series, wherein said cross point wire array comprises first direction wires connecting said first top electrical contacts of said single memory cells in said series and second direction wires connecting said second top electrical contacts of said single memory cells in said series.

2. The structure of claim 1, wherein said cross point wire array is adapted to allow a block erase process to be used to erase said information stored in said memory elements of all of said single memory cells of said series.

3. An integrated circuit structure comprising:
a double memory cell comprising:
- a first memory element having a first top electrical contact and a first bottom surface;
- a second memory element parallel to said first memory element and having a second top electrical contact and a second bottom surface; wherein said first memory element and said second memory element each comprise:
  - a first conductive layer;
  - a bi-stable layer on said first conductive layer, wherein said bi-stable layer comprises a material with a bi-stable, programmable, electrical resistance and wherein said programmable electrical resistance of said bi-stable layer is adapted to allow information to be repeatedly stored in and erased from said first memory element and said second memory element; and,
  - a second conductive layer on said bi-stable layer;
- a conductive section having a third top electrical contact and a third bottom surface and comprising a conductive material, wherein said conductive section is parallel to and disposed between said first memory element and said second memory element and wherein said third bottom surface is electrically connected to said first bottom surface and said second bottom surface;
a series of said double memory cells separated by an insulating material; and
a cross point wire array connecting said double memory cells in said series, wherein said cross point wire array comprises first direction wires connecting said first top electrical contacts of said double memory cells in said series, other first direction wires connecting said second top electrical contacts of said double memory cells in said series and second direction wires connecting said third top electrical contacts of said double memory cells in said series.

4. The structure of claim 3, wherein said cross point wire array is adapted to allow a block erase process to be used to erase said information stored in said first memory elements and said second memory elements of said double memory cells in said series.

5. The structure of claim 1, further comprising a diode electrically connecting said first bottom surface and said second bottom surface to establish an electric current between said memory element and said conductive section.

6. The structure of claim 1, wherein said bi-stable layer comprises a conditioned transition metal oxide.

7. The structure of claim 1, wherein said bi-stable layer comprises a conditioned perovskite material.

8. The structure of claim 3, further comprising:
- a diode electrically connected between said third bottom surface and said first bottom surface to establish an electric current; and
- another diode electrically connected between said third bottom surface and said second bottom surface to establish an electric current.

9. The structure of claim 3, wherein said bi-stable layer comprises a conditioned transition metal oxide.

10. The structure of claim 3, wherein said bi-stable layer comprises a conditioned perovskite material.

* * * * *